United States Patent
Onishi et al.

(10) Patent No.: US 7,224,105 B2
(45) Date of Patent: May 29, 2007

(54) PIEZOELECTRIC ELEMENT, COMPOSITE PIEZOELECTRIC ELEMENT, AND FILTER, DUPLEXER AND COMMUNICATION EQUIPMENT USING THE SAME

(75) Inventors: Keiji Onishi, Settsu (JP); Hiroyuki Nakamura, Katano (JP); Hiroshi Nakatsuka, Katano (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 246 days.

(21) Appl. No.: 10/990,435

(22) Filed: Nov. 18, 2004

(65) Prior Publication Data

US 2005/0110369 A1    May 26, 2005

(30) Foreign Application Priority Data

Nov. 20, 2003    (JP) .............................. 2003-390519

(51) Int. Cl.
  *H01L 41/047* (2006.01)
(52) U.S. Cl. ...................... 310/365; 310/363; 310/364; 310/366; 310/320
(58) Field of Classification Search ................ 310/320, 310/324, 363–366
  See application file for complete search history.

(56) References Cited

U.S. PATENT DOCUMENTS

| | | |
|---|---|---|
| 3,382,381 A | 5/1968 | Horton |
| 3,980,911 A | 9/1976 | English |
| 4,184,095 A | 1/1980 | Stacchiotti et al. |
| 4,639,632 A | 1/1987 | Nakata et al. |
| 2001/0054941 A1 | 12/2001 | Shibata et al. |
| 2003/0193269 A1 | 10/2003 | Jang et al. |

FOREIGN PATENT DOCUMENTS

| | | |
|---|---|---|
| EP | 1 170 862 | 1/2002 |
| JP | 9-130199 | 5/1997 |
| JP | 2002-314368 | 10/2002 |
| WO | 98/52280 | 11/1998 |

OTHER PUBLICATIONS

K. Lakin, Institute of Electrical and Electronics Engineers: "Thin film resonator technology", Proceedings of the 2003 IEEE International Frequency Control Symposium & PDA Exhibition Jointly with the 17th, European Frequency and Time Forum. Tampa, FL, May 4-8, 2003, IEEE International Frequency Control Symposium, New York, NY: IEEE, US, May 4, 2003 pp. 765-778 XP010688892.

*Primary Examiner*—Darren Schuberg
*Assistant Examiner*—J. Aguirrechea
(74) *Attorney, Agent, or Firm*—Wenderoth, Lind & Ponack, L.L.P.

(57) ABSTRACT

A piezoelectric element of the present invention includes a substrate, a lower electrode layer, a piezoelectric layer, an upper electrode layer, a cavity portion formed below a piezoelectric vibrating portion, and at least two bridging portions. The at least two bridging portions are formed so as not to be line-symmetric with respect to any line segment traversing the piezoelectric vibrating portion and/or so as not to be point-symmetric with respect to any point in the piezoelectric vibrating portion in a projection of the piezoelectric vibrating portion in the laminating direction.

17 Claims, 28 Drawing Sheets

PIEZOELECTRIC ELEMENT, COMPOSITE PIEZOELECTRIC ELEMENT, AND FILTER, DUPLEXER AND COMMUNICATION EQUIPMENT USING THE SAME

BACKGROUND OF THE INVENTION

1. Field of the Invention

The present invention relates to a piezoelectric element, more specifically, an improved piezoelectric element having good vibration characteristics in which unwanted signals based on unwanted vibrations (hereinafter, referred to as "spurious responses") are suppressed effectively. The present invention also relates to an improved composite piezoelectric element in which unwanted vibration modes do not interfere with each other between adjacent piezoelectric elements. The present invention also relates to a filter, a duplexer and communication equipment using the same.

2. Description of the Background Art

There is a demand for increasingly smaller and lighter components to be integrated in electronic equipment, in particular portable equipment. For example, for filters used in portable equipment, there is a demand for compactness, small insertion loss and large attenuation characteristics.

Filters using a piezoelectric element are known as filters that can satisfy these requirements.

FIG. 27A is a schematic cross-sectional view of a conventional piezoelectric element. FIG. 27B is an equivalent circuit diagram of this conventional piezoelectric element.

As shown in FIG. 27A, the conventional piezoelectric element includes a piezoelectric vibrating portion 90 on a substrate 91. A piezoelectric layer 92, an upper electrode layer 93, and a lower electrode layer 94 are laminated to form the piezoelectric vibrating portion 90. The upper electrode layer 93 and the lower electrode layer 94 sandwich the piezoelectric layer 92. A cavity portion 95 penetrating the substrate 91 is provided such that the lower surface of the piezoelectric vibrating portion 90 is exposed. The cavity portion 95 is provided in the substrate 91 in order to ensure free vibration of the piezoelectric vibrating portion 90.

When an electric field is applied between the upper electrode layer 93 and the lower electrode layer 94, electrical energy is converted into mechanical energy in the piezoelectric layer 92. For example, when aluminum nitride (AlN) having its polarization axis in the thickness direction is used as the piezoelectric layer 92, the mechanical energy is converted principally into a longitudinal vibration in the thickness direction. Thus, the piezoelectric layer 92 expands and contracts in the same direction as the electric field.

As shown in FIG. 27B, the equivalent circuit diagram of the conventional piezoelectric element includes a serial resonant circuit and a parallel resonant circuit. Therefore, the conventional piezoelectric element has a resonant frequency and an anti-resonant frequency. When the thickness of the piezoelectric vibrating portion 90 is taken as t, the conventional piezoelectric element resonates at a resonant frequency fr (=v/λ) corresponding to a wavelength λ that satisfies t=λ/2, where v is the ultrasonic velocity in the material constituting the piezoelectric vibrating portion 90. The anti-resonant frequency fa, similarly to the resonant frequency, is inversely proportional to the thickness t of the piezoelectric vibrating portion 90, and is proportional to the ultrasonic velocity in the material constituting the piezoelectric vibrating portion 90. When the resonant frequency and/or the anti-resonant frequency is to be set within a frequency band of several 100 MHz to several GHz, the thickness of the piezoelectric vibrating portion 90 corresponding to such a resonant frequency and/or anti-resonant frequency is a thickness that can be formed easily by industrial thin-film formation. Therefore, the conventional piezoelectric element is compact and is useful as a resonator having a high Q-value in the above-described frequency band.

In the piezoelectric vibrating portion 90, ideally, it is preferable that only vibrations in the thickness direction P of the piezoelectric layer 92 are present. However, the piezoelectric vibrating portion 90 is supported at its periphery by the substrate 91, and therefore the piezoelectric vibrating portion is constrained by the supporting portion in the substrate 91. Therefore, spurious responses tend to occur.

Furthermore, in the conventional piezoelectric element, vibrations in the lateral direction Q are also excited, so that a plurality of laterally propagating acoustic wave modes are present. These laterally propagating acoustic wave modes are unwanted vibration modes. The laterally propagating acoustic wave modes propagate in parallel to the surface of the electrode and effect multiple reflections at the side wall of the piezoelectric layer 92 or the end portions of the upper electrode layer 93 and the lower electrode layer 94, which causes spurious response. Furthermore, in the case of a composite piezoelectric element in which piezoelectric elements are arranged adjacent to each other, unwanted vibration modes interfere with each other between the adjacent piezoelectric elements, which causes spurious response. The spurious responses that are caused by the laterally propagating acoustic wave modes deteriorate the frequency characteristics of the piezoelectric element.

Various techniques have been proposed in order to solve the problem that the frequency characteristics of the piezoelectric element is deteriorated by the spurious responses. FIG. 28A is a top view of a conventional piezoelectric element disclosed in International Publication No. 98/52280. FIG. 28B is a cross-sectional view taken along the line B-B of the conventional piezoelectric element shown in FIG. 28A.

As shown in FIG. 28A and 28B, an insulating film 73 is formed on a substrate 81 having a cavity portion 85. A piezoelectric vibrating portion 80 is provided above the cavity portion 85, straddling the cavity portion 85. The opposite ends of the piezoelectric vibrating portion 80 are supported by the substrate 81. A lower electrode layer 84, a piezoelectric layer 82 and an upper electrode layer 83 are laminated to form the piezoelectric vibrating portion 80. The lower electrode layer 84 is connected to a wiring electrode 86. The end portion of the wiring electrode 86 constitutes a terminal electrode 87. The upper electrode layer 83 is connected to a terminal electrode 71 via a connection portion 88, a wiring electrode 89 and a connection portion 70. A mask 72 is a mask for forming the cavity portion 85. According to the conventional piezoelectric element shown in FIGS. 28A and 28B, the piezoelectric vibrating portion 80 is supported above the cavity portion 85 by the substrate 81 with two supporting portions 74 and 75. Therefore, the constraint from the substrate 81 on the piezoelectric vibrating portion 80 becomes small. Thus, spurious responses are suppressed to some extent. However, the piezoelectric vibrating portion 80 is supported at symmetric positions with respect to the substrate 81, so that in particular, the laterally propagating acoustic wave modes cannot sufficiently be suppressed.

FIG. 29A is a top view of another conventional piezoelectric element disclosed in Japanese Laid-Open Patent Publication No. 9-130199. FIG. 29B is a cross-sectional view taken along the line B-B of the conventional piezoelectric element shown in FIG. 29A.

As shown in FIGS. 29A and 29B, a piezoelectric vibrating portion 60 is provided above a substrate 61 having a cavity portion 65, straddling the cavity portion 65 via a support member 53. A lower electrode layer 64, a piezoelectric layer 62 and an upper electrode layer 63 are laminated to form the piezoelectric vibrating portion 60. The lower electrode layer 64 is connected to a terminal electrode 67 via a wiring electrode 66. The upper electrode layer 63 is connected to a terminal electrode 51 via a wiring electrode 69. An etching hole 54 is provided for forming the cavity portion 65 in the substrate 61. A protective film 55 is provided to protect the lower electrode layer 64 from the etchant during etching. According to the conventional piezoelectric element shown in FIGS. 29A and 29B, the piezoelectric vibrating portion 60 is supported by the substrate 61 with two supporting portions 56 and 57. Therefore, the constraint from the substrate 61 on the piezoelectric vibrating portion 60 becomes small. Thus, spurious responses are suppressed to some extent. However, similarly to the above example, the piezoelectric vibrating portion 60 is supported at symmetric positions with respect to the substrate 61, so that in particular, the laterally propagating acoustic wave modes cannot sufficiently be suppressed.

Furthermore, the conventional piezoelectric element shown in FIGS. 28A and 28B has the following problem. The piezoelectric vibrating portion 80 is supported by the substrate 81 with two supporting portions 74 and 75. The supporting portions 74 and 75 are line-symmetric with respect to a line segment L. Therefore, the piezoelectric vibrating portion 80 is easily twisted or easily vibrates in the width direction. Therefore, spurious responses (e.g., unwanted vibration including twist components or unwanted lateral vibration) caused by the symmetric property of the supporting portions 74 and 75 may occur, in addition to the longitudinal vibration in the thickness direction, which is the main resonance. Thus, in the conventional piezoelectric element shown in FIGS. 28A and 28B, spurious responses cannot be suppressed effectively.

Furthermore, the conventional piezoelectric element shown in FIGS. 29A and 29B has the following problem. The piezoelectric vibrating portion 60 is supported by the substrate 61 with two supporting portions 56 and 57. The supporting portions 56 and 57 are point-symmetric with respect to a point O. Therefore, the piezoelectric vibrating portion 60 is easily twisted or easily vibrates in the width direction. Therefore, in this case as well, spurious responses (e.g., unwanted vibration including twist components or unwanted lateral vibration) caused by the symmetric property of the supporting portions 56 and 57 may occur, in addition to the longitudinal vibration in the thickness direction, which is the main resonance. Furthermore, the vibration mode that propagates in an oblique direction from the end portion of the upper electrode layer 63 or the lower electrode layer 64 is confined in the piezoelectric vibrating portion 60. The confined vibration mode causes spurious responses. Thus, in the conventional piezoelectric element shown in FIGS. 29A and 29B, spurious responses cannot be suppressed effectively.

SUMMARY OF THE INVENTION

Therefore, an object of the present invention is to provide an improved piezoelectric element with which spurious responses can be suppressed effectively. Another object of the present invention is to provide an improved piezoelectric element that has good vibration characteristics. Another object of the present invention is to provide a piezoelectric element having excellent mechanical strength. Furthermore, another object of the present invention is to provide an improved composite piezoelectric element so that unwanted vibration modes do not interfere with each other between the adjacent piezoelectric elements. Furthermore, another object of the present invention is to provide a filter, a duplexer and communication equipment using such a piezoelectric element or composite piezoelectric element.

The present invention has the following features to attain the object mentioned above. A first aspect of the present invention is directed to a piezoelectric element including a substrate, a lower electrode layer laminated on or above the substrate, a piezoelectric layer laminated on or above the lower electrode layer, an upper electrode layer laminated on or above the piezoelectric layer, a cavity portion formed below a piezoelectric vibrating portion including the lower electrode layer, the piezoelectric layer and the upper electrode layer, and at least two bridging portions extending from a portion of a periphery of the piezoelectric vibrating portion, for supporting the piezoelectric vibrating portion with the substrate above the cavity portion. The at least two bridging portions are formed so as not to be line-symmetric with respect to any line segment traversing the piezoelectric vibrating portion and/or so as not to be point-symmetric with respect to any point in the piezoelectric vibrating portion in a projection of the piezoelectric vibrating portion in the laminating direction.

Thus, according to the first aspect of the present invention, the piezoelectric vibrating portion is provided above the cavity portion, vibration close to free vibration can be obtained, and the effective electromechanical coupling factor can be large. Furthermore, the two bridging portions are formed so as not to be line-symmetric with respect to any line segment traversing the piezoelectric vibrating portion and/or so as not to be point-symmetric with respect to any point in the piezoelectric vibrating portion in the projection in the laminating direction. Therefore, spurious responses caused by the symmetry of the supporting portions can be suppressed.

It is preferable that the cavity portion is formed by processing the substrate. Furthermore, the cavity portion may be formed by processing a cavity portion-forming layer for forming the cavity portion that is provided on the substrate.

Thus, the cavity portion can be formed easily.

It is preferable that the piezoelectric element further includes a dielectric layer provided so as to be in contact with at least one selected from the group consisting of the lower electrode layer, the piezoelectric layer and the upper electrode layer.

Thus, the adhesive strength can be increased by interposing the dielectric layer. Moreover, although the piezoelectric layer has a large temperature coefficient with respect to the resonant frequency, the elastic constant can be compensated with respect to temperature changes by additionally providing the dielectric layer. As a result, the change in the resonant frequency with respect to temperature changes is reduced.

It is preferable that the dielectric layer is provided between the substrate and the lower electrode layer.

Thus, the adhesive strength between the substrate and the lower electrode layer is increased. When a silicon semiconductor is used for the substrate, the dielectric layer serves as an insulating layer.

It is preferable that the bridging portions are formed by extending at least one selected from the group consisting of the lower electrode layer, the piezoelectric layer, the upper electrode layer and the dielectric layer.

Thus, a special production process for forming the bridging portion is eliminated.

It is preferable that the at least one selected from the group consisting of the lower electrode layer, the piezoelectric layer, the upper electrode layer and the dielectric layer is formed so as to extend up to at least a portion of a peripheral portion of the cavity portion.

Thus, the strength for supporting the piezoelectric vibrating portion is increased.

It is preferable that the at least two bridging portions include a first bridging portion including a portion extended from the upper electrode layer and a second bridging portion including a portion extended from the lower electrode layer. The piezoelectric element further includes a first wiring electrode that is provided in a peripheral portion of the cavity portion on or above the substrate so as to be electrically connected to the portion extended from the upper electrode layer and that is connected to a first terminal electrode, and a second wiring electrode that is provided in a peripheral portion of the cavity portion on or above the substrate so as to be electrically connected to the portion extended from the lower electrode layer and that is connected to a second terminal electrode.

With this feature, the first bridging portion and the upper electrode layer can be electrically connected, and the second bridging portion and the lower electrode layer can be electrically connected.

It is preferable that the first wiring electrode is provided such that a first central line connecting the center of the piezoelectric vibrating portion and the center of the first bridging portion is not overlapped with a second central line connecting the center of the piezoelectric vibrating portion and the center of the first wiring electrode in a projection in the laminating direction, and the second wiring electrode is provided such that a third central line connecting the center of the piezoelectric vibrating portion and the center of the second bridging portion is not overlapped with a fourth central line connecting the center of the piezoelectric vibrating portion and the center of the second wiring electrode in a projection in the laminating direction.

It is preferable that the first bridging portion is provided such that the first bridging portion is not provided between the piezoelectric vibrating portion and the first wiring electrode in the laminating direction, and the second bridging portion is provided such that the second bridging portion is not provided between the piezoelectric vibrating portion and the second wiring electrode in the laminating direction.

With this feature, electrical signals of high power do not enter the piezoelectric vibrating portion from the wiring electrode at one time. Therefore, the breakdown of the piezoelectric element can be prevented. As a result, the rated power of the piezoelectric element can be increased.

It is preferable that the piezoelectric element further includes a first relay electrode electrically connected to the upper electrode layer extending up to a periphery of the cavity portion via the at least two bridging portions; and a second relay electrode electrically connected to the lower electrode layer extending up to a periphery of the cavity portion via the at least two bridging portions.

By providing the first and second relay electrodes in this manner, an input voltage can be supplied uniformly to the piezoelectric vibrating portion from the periphery of the piezoelectric vibrating portion through the bridging portions.

It is preferable that at least one of the first relay electrode and the second relay electrode is provided in a ring-shape or a frame-shape along the periphery of the cavity portion.

Thus, it is expected that an input voltage can be supplied most uniformly.

A second aspect of the present invention is directed to a composite piezoelectric element in which at least two piezoelectric elements are electrically connected to each other, at least one of the piezoelectric elements including a substrate, a lower electrode layer laminated on or above the substrate, a piezoelectric layer laminated on or above the lower electrode layer, an upper electrode layer laminated on or above the piezoelectric layer, a cavity portion formed below a piezoelectric vibrating portion including the lower electrode layer, the piezoelectric layer and the upper electrode layer, and at least two bridging portions extending from a portion of a periphery of the piezoelectric vibrating portion, for supporting the piezoelectric vibrating portion with the substrate above the cavity portion. The at least two bridging portions are formed so as not to be line-symmetric with respect to any line segment traversing the piezoelectric vibrating portion and/or so as not to be point-symmetric with respect to any point in the piezoelectric vibrating portion in a projection of the piezoelectric vibrating portion in the laminating direction.

Thus, a composite piezoelectric element having good characteristics can be provided by using a piezoelectric element in which spurious responses are suppressed.

A third aspect of the present invention is directed to a piezoelectric element including a substrate, a lower electrode layer laminated on or above the substrate, a piezoelectric layer laminated on or above the lower electrode layer, an upper electrode layer laminated on or above the piezoelectric layer, a mirror layer formed below a piezoelectric vibrating portion including the lower electrode layer, the piezoelectric layer and the upper electrode layer, a first joint portion including a portion extended from the upper electrode layer, for electrically and mechanically connecting to a first wiring electrode formed on the mirror layer, and a second joint portion including a portion extended from the lower electrode layer, for electrically and mechanically connecting to a second wiring electrode formed on the mirror layer. The first joint portion and the second joint portion are formed so as not to be line-symmetric with respect to any line segment traversing the piezoelectric vibrating portion and/or so as not to be point-symmetric with respect to any point in the piezoelectric vibrating portion in a projection of the piezoelectric vibrating portion in the laminating direction.

In this manner, the first and the second joint portions are formed so as not to be line-symmetric with respect to any line segment traversing the piezoelectric vibrating portion and/or so as not to be point-symmetric with respect to any point in the piezoelectric vibrating portion in the projection in the laminating direction. Therefore, spurious responses caused by the symmetry of the supporting portions can be suppressed.

A fourth aspect of the present invention is directed to a filter including a plurality of piezoelectric elements, at least one of the piezoelectric elements including a substrate, a lower electrode layer laminated on or above the substrate, a piezoelectric layer laminated on or above the lower electrode layer, an upper electrode layer laminated on or above the piezoelectric layer, a cavity portion formed below a piezoelectric vibrating portion including the lower electrode layer, the piezoelectric layer and the upper electrode layer, and at least two bridging portions extending from a portion of a periphery of the piezoelectric vibrating portion, for supporting the piezoelectric vibrating portion with the substrate above the cavity portion. The at least two bridging portions are formed so as not to be line-symmetric with respect to any line segment traversing the piezoelectric vibrating portion and/or so as not to be point-symmetric with respect to any point in the piezoelectric vibrating portion in a projection of the piezoelectric vibrating portion in the laminating direction.

A fifth aspect of the present invention is directed to a duplexer including a filter including a plurality of piezoelectric elements, at least one of the piezoelectric elements including a substrate, a lower electrode layer laminated on or above the substrate, a piezoelectric layer laminated on or above the lower electrode layer, an upper electrode layer laminated on or above the piezoelectric layer, a cavity portion formed below a piezoelectric vibrating portion including the lower electrode layer, the piezoelectric layer and the upper electrode layer, and at least two bridging portions extending from a portion of a periphery of the piezoelectric vibrating portion, for supporting the piezoelectric vibrating portion with the substrate above the cavity portion. The at least two bridging portions are formed so as not to be line-symmetric with respect to any line segment traversing the piezoelectric vibrating portion and/or so as not to be point-symmetric with respect to any point in the piezoelectric vibrating portion in a projection of the piezoelectric vibrating portion in the laminating direction.

A sixth aspect of the present invention is directed to communication equipment including a piezoelectric element, the piezoelectric element including a substrate, a lower electrode layer laminated on or above the substrate, a piezoelectric layer laminated on or above the lower electrode layer, an upper electrode layer laminated on or above the piezoelectric layer, a cavity portion formed below a piezoelectric vibrating portion including the lower electrode layer, the piezoelectric layer and the upper electrode layer, and at least two bridging portions extending from a portion of a periphery of the piezoelectric vibrating portion, for supporting the piezoelectric vibrating portion with the substrate above the cavity portion. The at least two bridging portions are formed so as not to be line-symmetric with respect to any line segment traversing the piezoelectric vibrating portion and/or so as not to be point-symmetric with respect to any point in the piezoelectric vibrating portion in a projection of the piezoelectric vibrating portion in the laminating direction.

According to the present invention, a piezoelectric element having good vibration characteristics in which spurious responses caused by the symmetry of the supporting portions of the substrate can be suppressed effectively can be provided. Moreover, a piezoelectric element having excellent mechanical strength can be provided. According to the present invention, a composite piezoelectric element having good characteristics in which unwanted vibration modes do not interfere with each other between adjacent piezoelectric elements can be provided. Moreover, the present invention provides a filter, a duplexer and communication equipment using such a piezoelectric element or a composite piezoelectric element.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
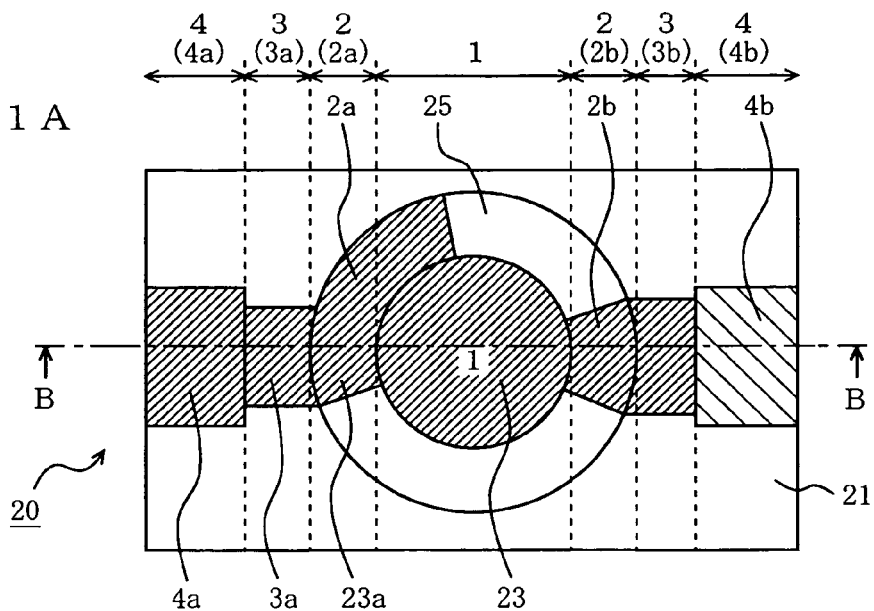
FIG. 1A is a top view of a piezoelectric element 20 of a first embodiment of the present invention.

In the present invention, a piezoelectric vibrating portion is supported above a cavity portion by at least two bridging portions with the substrate. These two or more supporting portions are formed so as not to be line-symmetric with respect to any line segment traversing the piezoelectric vibrating portion and/or so as not to be point-symmetric with respect to any point in the piezoelectric vibrating portion in the projection of the piezoelectric vibrating portion in the laminating direction. Thus, spurious responses caused by the supporting portions for supporting the piezoelectric vibrating portion with the substrate can be suppressed. Hereinafter, the features of the present invention will be described with reference of the accompanying drawings. In the drawings, portions bearing the same reference numeral are identical portions or have the same function.

First Embodiment

Figure 1B:
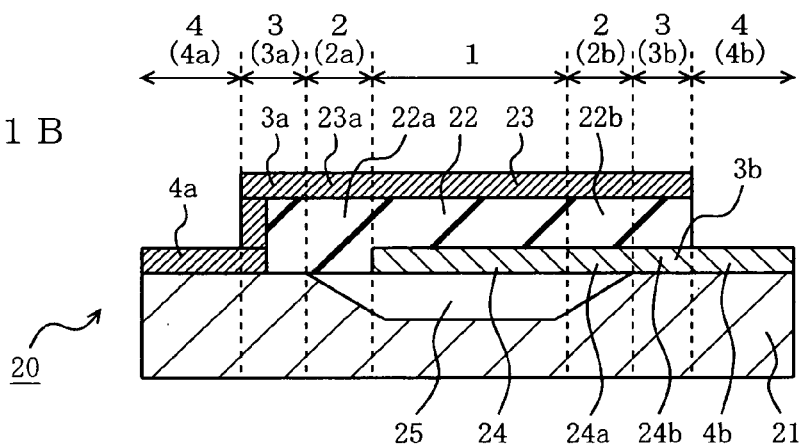
FIG. 1B is a cross-sectional view taken along the line B-B in FIG. 1A of the piezoelectric element 20 of the first embodiment.
Figure 1C:
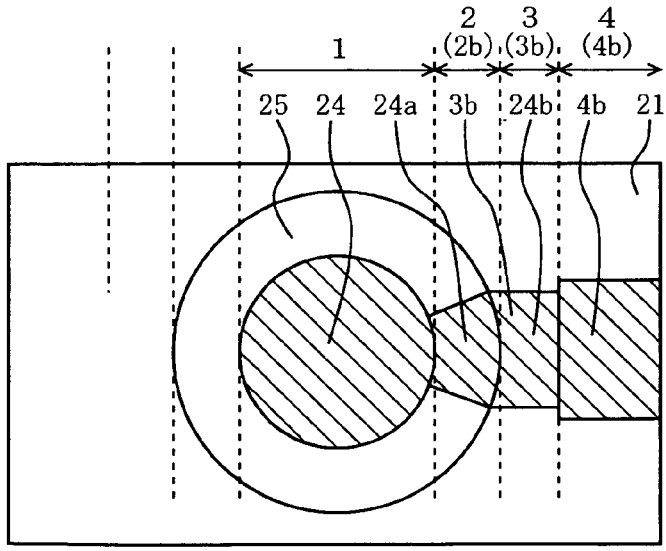
FIG. 1C is a plan view of an extracted portion of a lower electrode layer and its vicinity.

FIG. 1A is a top view of a piezoelectric element 20 of a first embodiment of the present invention. FIG. 1B is a cross-sectional view taken along the line B-B in FIG. 1A of the piezoelectric element 20 of the first embodiment. FIG. 1C is a plan view of an extracted portion of a lower electrode layer and its vicinity.

In FIGS. 1A to 1C, the piezoelectric element 20 includes a piezoelectric vibrating portion 1, two bridging portions 2 (2a, 2b), two wiring electrode portions 3 (3a, 3b), and two terminal electrode portions 4 (4a, 4b).

The piezoelectric vibrating portion 1 includes a lower electrode layer 24 laminated on a substrate 21, a piezoelectric layer 22 laminated on the lower electrode layer 24, and an upper electrode layer 23 laminated on the piezoelectric layer 22. The piezoelectric vibrating portion 1 is provided above a cavity portion 25 formed on the surface of the substrate 21. The material of the piezoelectric layer 22 is a suitable piezoelectric material such as zinc oxide (ZnO), lead zirconate titanate (PZT), or aluminum nitride (AlN). The materials of the upper electrode layer 23 and the lower electrode layer 24 are suitable materials such as molybdenum (Mo), tungsten (W), aluminum (Al), titanium (Ti), cupper (Cu), platinum (Pt) or gold (Au).

The two bridging portions 2 are a first bridging portion 2a and a second bridging portion 2b. In FIGS. 1A to 1C, for convenience, the dotted lines indicating the bridging portions 2 do not completely coincide with the first bridging portion 2a or the second bridging portion 2b. In FIG. 1A, the first bridging portion 2a is the hatched portion indicated by reference numeral 2a (the same applies to the following). In FIG. 1A, the second bridging portion 2b is the hatched portion indicated by reference numeral 2b (the same applies to the following).

The two wiring electrode portions 3 are a first wiring electrode 3a and a second wiring electrode 3b including the lower electrode layer 24b.

The two terminal electrode portions 4 are a first terminal electrode 4a and a second terminal electrode 4b.

The first and the second bridging portions 2a and 2b extend from a portion of the periphery of the piezoelectric vibrating portion 1. The first and the second bridging portions 2a and 2b support the piezoelectric vibrating portion 1 above the cavity portion 25 in order to secure the piezoelectric vibrating portion to the substrate 21. The first and the second bridging portions 2a and 2b are formed so as not to be line-symmetric with respect to any line segment traversing the piezoelectric vibrating portion 1 and/or so as not to be point-symmetric with respect to any point in the piezoelectric vibrating portion 1 in the projection of the piezoelectric vibrating portion 1 in the laminating direction.

The first bridging portions 2a includes a portion 23a that is a portion of the upper electrode layer 23 and extends from the periphery of the piezoelectric vibrating portion 1 and a portion 22a that is a portion of the piezoelectric layer 22 and extends from the periphery of the piezoelectric vibrating portion 1. The extended portion 22a of the piezoelectric layer 22 extends up to the peripheral portion of the cavity portion 25. The extended portion 23a of the upper electrode layer 23 is connected to the first wiring electrode 3a that is formed on the portion 22a of the piezoelectric layer 22 extending to the peripheral portion of the cavity portion 25. The first wiring electrode 3a is connected to the first terminal electrode 4a.

The second bridging portion 2b includes a portion 24a that is a portion of the lower electrode layer 24 and extends from the periphery of the piezoelectric vibrating portion 1 and a portion 22b that is a portion of the piezoelectric layer 22 and extends from the periphery of the piezoelectric vibrating portion 1. The extended portion 22b of the piezoelectric layer 22 extends up to the peripheral portion of the cavity portion 25. Furthermore, the extended portion 24a of the lower electrode layer 24 extends up to the peripheral portion of the cavity portion 25. The extended portion 24b of the lower electrode layer 24 extending to the peripheral portion of the cavity portion 25 becomes the second wiring electrode 3b. The second wiring electrode 3b is connected to the second terminal electrode 4b. The upper electrode layer 23 extends so as to overlap with the extended portion 24a of the lower electrode layer 24 and the further extended portion 24b.

Thus, the first and the second bridging portions 2a and 2b have a multilayered structure. Therefore, the mechanical strength for supporting the piezoelectric vibrating portion 1 is increased.

The equivalent circuit diagram of a piezoelectric element of this embodiment corresponds to that of FIG. 26B. However, the upper electrode layer 23 is formed above the extended portion 24a of the lower electrode layer 24 and the further extended portion 24b so that the piezoelectric layer 22 is sandwiched. Therefore, a new capacitor is formed in these extended portions 24a and 24b. Thus, the capacitance of the piezoelectric element 20 can be adjusted by adjusting the capacitance of the new capacitor.

Next, a method for producing the piezoelectric element 20 of the first embodiment will be described below. First, the cavity portion 25 is formed in the surface of the substrate 21. Then, a sacrificial layer is filled in the cavity portion 25 with, for example, PSG or $SiO_2$. Then, the lower electrode layer 24, the piezoelectric layer 22, the upper electrode layer 23 and the terminal electrodes are laminated on the cavity portion 25 that is filled with the sacrificial layer. Thereafter, the sacrificial layer is removed by etching with, for example, a hydrogen fluoride aqueous solution. Thus, the piezoelectric element 20 is formed.

In the piezoelectric element 20 of the first embodiment, the piezoelectric vibrating portion 1 is provided above the cavity portion 25 and is supported at two portions by the first and the second bridging portions 2a and 2b with the substrate 21. Therefore, the piezoelectric vibrating portion 1 vibrates substantially in a manner close to free vibration, so that the effective electromechanical coupling factor is increased. As a result, electrical energy applied between the electrodes of the piezoelectric element 20 is converted into mechanical energy more efficiently than before.

In the piezoelectric element 20 of the first embodiment, the first and the second bridging portions 2a and 2b supporting the piezoelectric vibrating portion 1 are formed so as not to be line-symmetric with respect to any line segment traversing the piezoelectric vibrating portion 1 and/or so as not to be point-symmetric with respect to any point in the piezoelectric vibrating portion 1 in the projection of the piezoelectric vibrating portion 1 in the laminating direction. Therefore, the piezoelectric vibrating portion 1 is hardly twisted. Furthermore, in the piezoelectric vibrating portion 1, hardly any vibrations occur in the lateral direction. Therefore, in the piezoelectric element 20 of the first embodiment, there is hardly any source for spurious responses. Therefore, in the piezoelectric element 20 of the first embodiment, spurious responses caused by the symmetry of the supporting portions can be further suppressed than the conventional piezoelectric element. As a result, the piezoelectric element of the first embodiment serves as a resonator having good frequency characteristics that can attenuate unwanted vibration modes.

It should be noted that in the first embodiment, the cavity portion 25 is formed only on the surface of the substrate 21, but the present invention is not limited thereto, as long as the cavity portion is formed. For example, a cavity portion can be formed by penetrating a substrate vertically, or by forming a cavity portion-forming layer on a substrate.

Figure 2A:
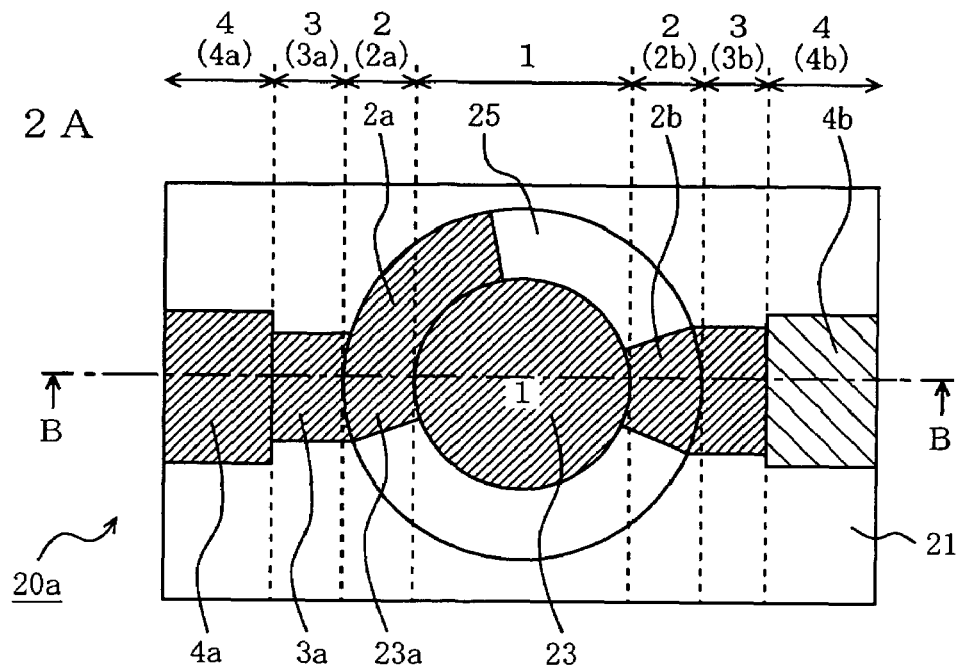
FIG. 2A is a top view of a piezoelectric element 20a when a cavity portion is formed so as to penetrate a substrate vertically.
Figure 2B:
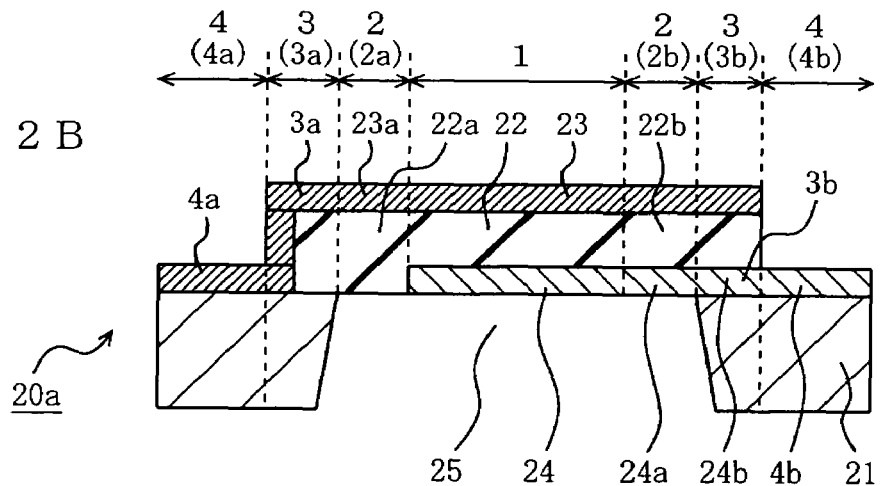
FIG. 2B is a cross-sectional view taken along the line B-B in FIG. 2A of the piezoelectric element 20a when a cavity portion is formed so as to penetrate a substrate vertically.

FIG. 2A is a top view of a piezoelectric element 20a when a cavity portion is formed so as to penetrate a substrate vertically. FIG. 2B is a cross-sectional view taken along the line B-B in FIG. 2A of the piezoelectric element 20a when a cavity portion is formed so as to penetrate a substrate vertically. As shown in FIGS. 2A and 2B, a cavity portion 25 can be formed by penetrating a substrate 21 vertically. A method of producing this cavity portion is as follows. First, a lower electrode layer 24, a piezoelectric layer 22, an upper electrode layer 23, and terminal electrode portions 4 are formed on the substrate 21. Then, the bottom portion of the substrate 21 is removed so that the cavity portion 25 is formed.

Figure 3A:
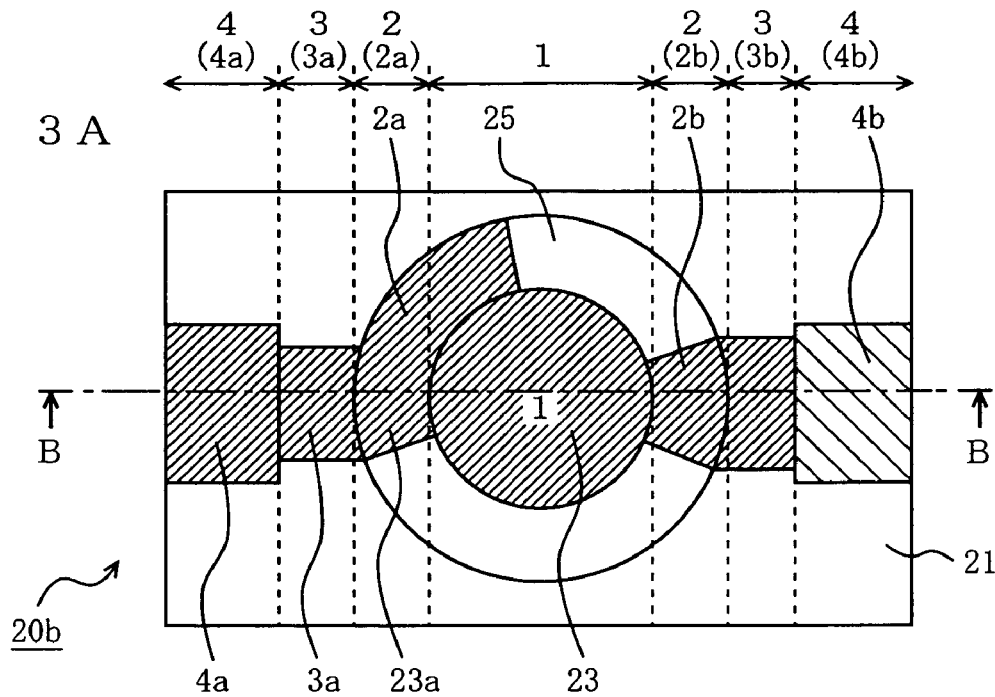
FIG. 3A is a top view of a piezoelectric element 20b when a cavity portion is formed by forming a cavity portion-forming layer on a substrate.
Figure 3B:
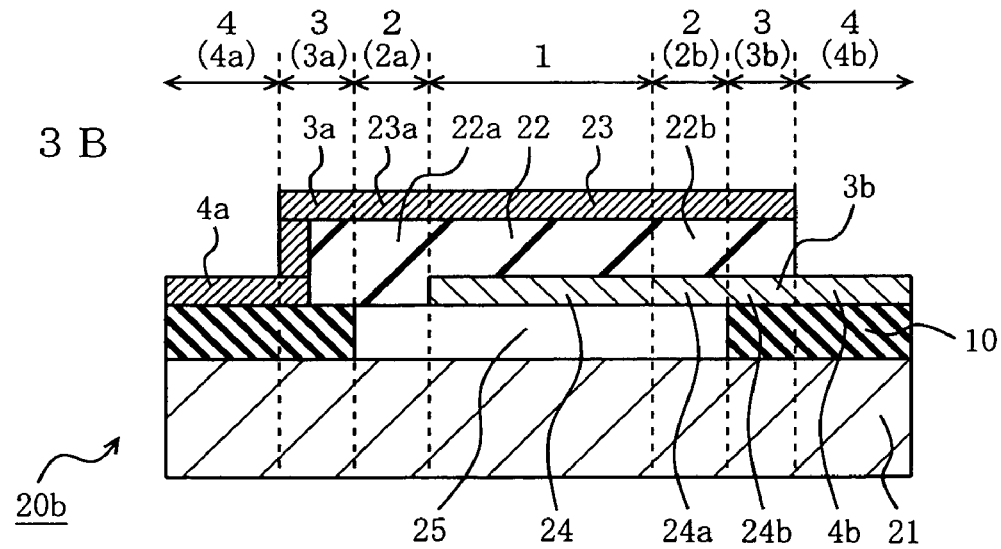
FIG. 3B is an end view taken along the line B-B in FIG. 3A of the piezoelectric element 20b when a cavity portion is formed by forming a cavity portion-forming layer on a substrate.

FIG. 3A is a top view of a piezoelectric element 20b when a cavity portion is formed by forming a cavity portion-forming layer on a substrate. FIG. 3B is an end view taken along the line B-B in FIG. 3A of the piezoelectric element 20b when a cavity portion is formed by forming a cavity portion-forming layer on a substrate. As shown in FIGS. 3A and 3B, a cavity portion 25 can be formed by forming the cavity portion-forming layer 10. The cavity portion-forming layer 10 is formed of a dielectric thin film such as silicon oxide or silicon nitride. Furthermore, the cavity portion-forming layer 10 may be a multilayered film made of a conductor such as metal, as long as the surface of the cavity portion-forming layer that is contact with the resonator portion is dielectric. A method of producing the cavity portion is as follows. First, a cavity portion-forming layer 10 is provided on a substrate 21. Then, a cavity portion 25 is formed by vertically penetrating the cavity portion-forming layer 10. Then, a sacrificial layer (e.g., PSG or SiO2) is filled in the cavity portion 25. Then, a lower electrode layer 24, a piezoelectric layer 22, an upper electrode layer 23 and terminal electrode portions 4 are formed on the cavity portion 25 that is filled with the sacrificial layer. Finally, the sacrificial layer is removed by etching from the opening portion of the cavity portion 25.

Second Embodiment

Figure 4A:
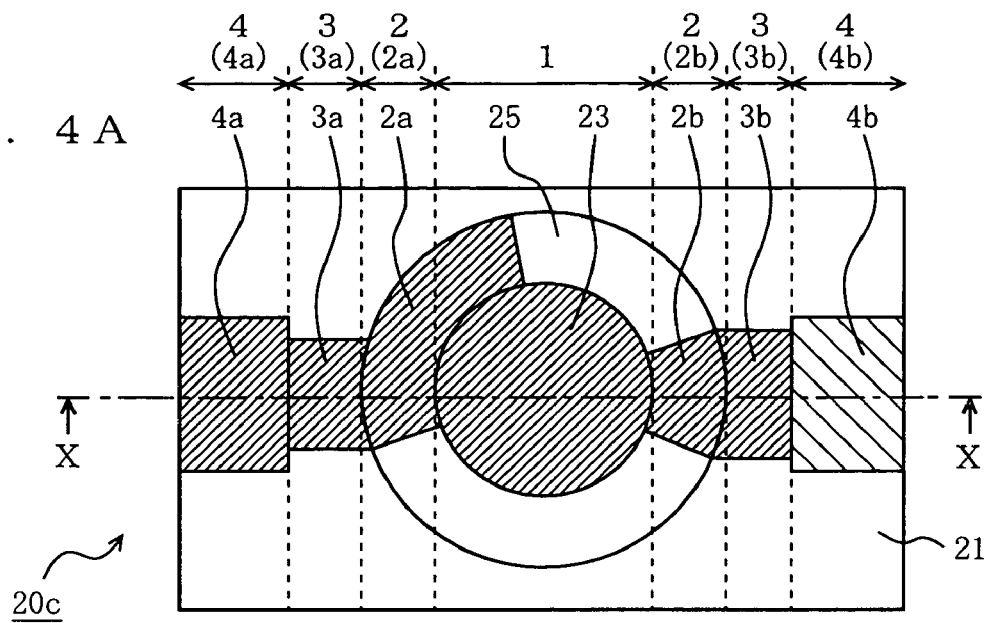
FIG. 4A is a top view of a piezoelectric element 20c of a second embodiment of the present invention.
Figure 4B:
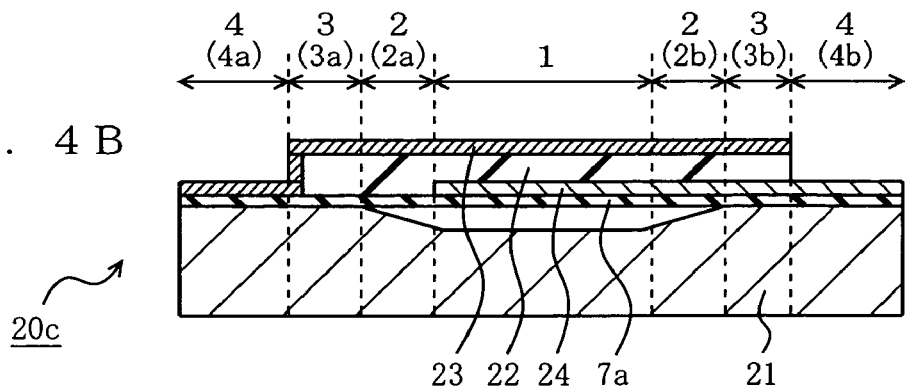
FIG. 4B is a view showing a first example of the cross-section taken along the line X-X in FIG. 4A of the piezoelectric element 20c of the second embodiment.
Figure 4C:
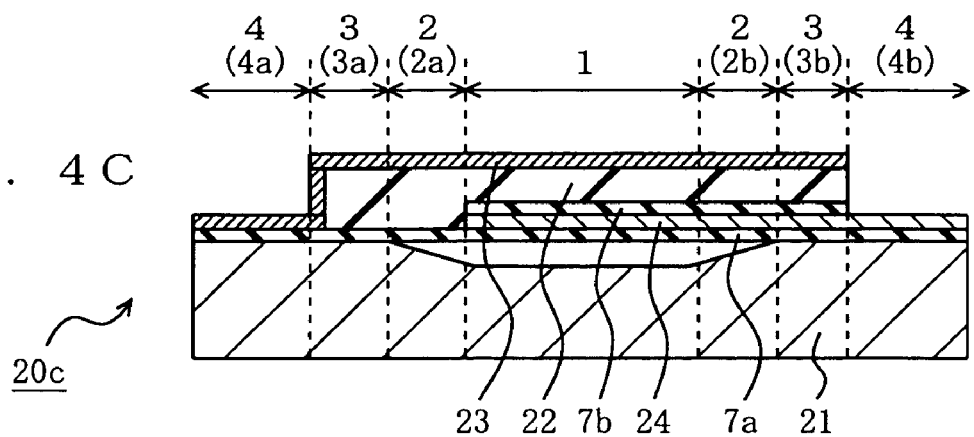
FIG. 4C is a view showing a second example of the cross-section taken along the line X-X in FIG. 4A of the piezoelectric element 20c of the second embodiment.
Figure 4D:
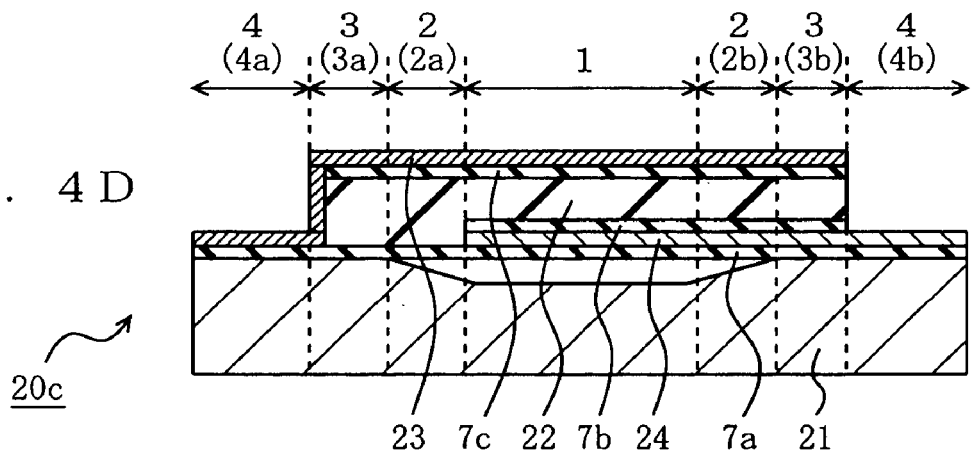
FIG. 4D is a view showing a third example of the cross-section taken along the line X-X in FIG. 4A of the piezoelectric element 20c of the second embodiment.

FIG. 4A is a top view of a piezoelectric element 20c of a second embodiment of the present invention. FIG. 4B is a view showing a first example of the cross-section taken along the line X-X in FIG. 4A of the piezoelectric element 20c of the second embodiment. FIG. 4C is a view showing a second example of the cross-section taken along the line X-X in FIG. 4A of the piezoelectric element 20c of the second embodiment. FIG. 4D is a view showing a third example of the cross-section taken along the line X-X in FIG. 4A of the piezoelectric element 20c of the second embodiment.

As shown in FIG. 4B, in the first example, the piezoelectric element 20c is provided additionally with a dielectric layer 7a between the lower electrode layer 24 and the substrate 21. When the substrate 21 is a semiconductor such as a silicon substrate, the dielectric layer 7a functions as an insulating substrate. Since the dielectric layer 7a is added to the components constituting the first and the second bridging portions 2a and 2b by providing the dielectric layer 7a, the mechanical strength of the first and the second bridging portions 2a and 2b is increased.

As shown in FIG. 4C, in the second example, the piezoelectric element 20c is further provided additionally with a dielectric layer 7b between the lower electrode layer 24 and the piezoelectric layer 22. In the structure in which the piezoelectric layer 22 and the lower electrode layer 24 are in direct contact with each other, the adhesive strength between the piezoelectric layer 22 and the lower electrode layer 24 is weak, and therefore the structure lacks reliability. However, when the dielectric layer 7b is interposed between the piezoelectric layer 22 and the lower electrode layer 24, as in the second example, then the adhesive strength is increased and the reliability of the structure is improved. Furthermore, the resonant frequency of the piezoelectric layer 22 itself changes significantly with respect to temperature changes. In other words, the piezoelectric layer has a large temperature coefficient with respect to temperature changes. However, when the dielectric layer 7b is formed of SiO2, the elastic constant can be compensated with respect to temperature changes. Therefore, the change in the resonant frequency with respect to temperature changes is reduced. Furthermore, the dielectric layer 7b is added to the second bridging portion 2b as a component constituting the second bridging portion 2b. Therefore, the mechanical strength of the second bridging portion 2b is further increased. Furthermore, when the dielectric layer 7b is interposed between the piezoelectric layer 22 and the lower electrode layer 24, the effect of further reducing spurious responses can also be obtained.

As shown in FIG. 4D, in the third example, the piezoelectric element 20c is further provided additionally with a dielectric layer 7c between the upper electrode layer 23 and the piezoelectric layer 22. In a structure in which the piezoelectric layer 22 and the upper electrode layer 23 are in direct contact with each other, the adhesive strength between the piezoelectric layer 22 and the upper electrode layer 23 is weak, and therefore the structure lacks reliability. However, when the dielectric layer 7c is interposed between the piezoelectric layer 22 and the upper electrode layer 23, as in the third example, then the adhesive strength is increased and the reliability of the structure is improved. Furthermore, the resonant frequency of the piezoelectric layer 22 itself changes significantly with respect to temperature changes. In other words, the piezoelectric layer has a large temperature coefficient with respect to temperature changes. However, when the dielectric layer 7c is formed of $SiO_2$, the elastic constant can be compensated with respect to temperature changes. Therefore, the change in the resonant frequency with respect to temperature changes is reduced. Furthermore, the dielectric layer 7c is added to the first bridging portion 2a as a component constituting the first bridging portion 2a. Therefore, the mechanical strength of the first bridging portion 2a is further increased. Furthermore, when the dielectric layer 7c is interposed between the piezoelectric layer 22 and the upper electrode layer 23, the effect of further reducing spurious responses can be also obtained. Furthermore, when the dielectric layer 7c is interposed between the piezoelectric layer 22 and the upper electrode layer 23, the effect of further reducing spurious responses can also be obtained.

In the second embodiment, although it is most effective to provide all of the dielectric layers 7a, 7b, and 7c that are shown in the first to third examples, a certain effect can be obtained by providing at least one of the dielectric layers in the piezoelectric element. That is to say, the bridging portion may be formed by extending at least one layer selected from a group consisting of the lower electrode layer, the piezoelectric layer, the upper electrode layer and the dielectric layer.

As shown in the first and the second embodiments, it is sufficient that the piezoelectric layer is provided on or above the lower electrode layer. Furthermore, it is sufficient that the upper electrode layer is provided on or above the piezoelectric layer.

Third Embodiment

The third embodiment of the present invention is a variant example of the first embodiment of the present invention.

Figure 5A:
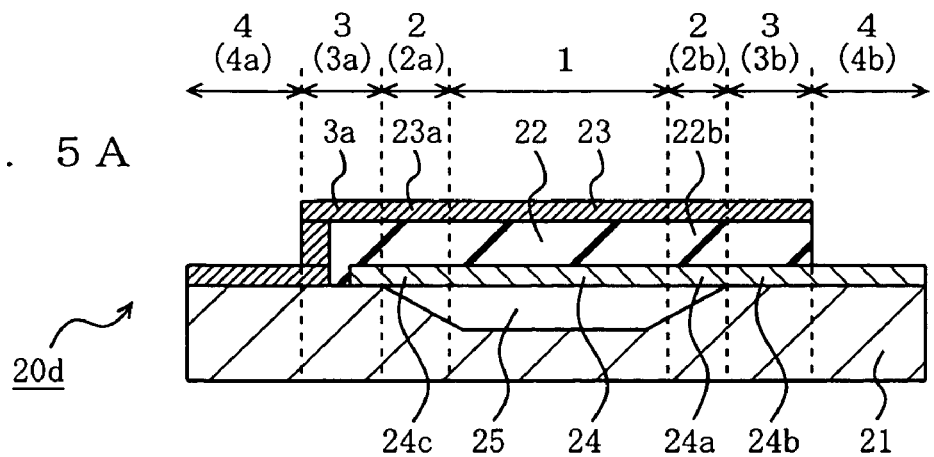
FIG. 5A is a view showing a first example of the cross-section of the piezoelectric element 20d of a third embodiment.

FIG. 5A is a view showing a first example of the cross-section of the piezoelectric element 20d of the third embodiment. In the first embodiment, as shown in FIG. 1B, the lower electrode layer 24 does not straddle the cavity portion 25. On the other hand, in the first example of the third embodiment, as shown in FIG. 5A, the lower electrode layer 24 includes a portion 24c. In other words, the lower electrode layer 24 is formed so as to straddle the cavity portion 25. With this configuration, the mechanical strength of the first bridging portion 2a can be increased. In addition, the capacitance of the capacitor can be adjusted by extending the lower electrode layer 24 to increase the area in which the upper electrode layer 23 opposes the lower electrode layer 24.

Figure 5B:
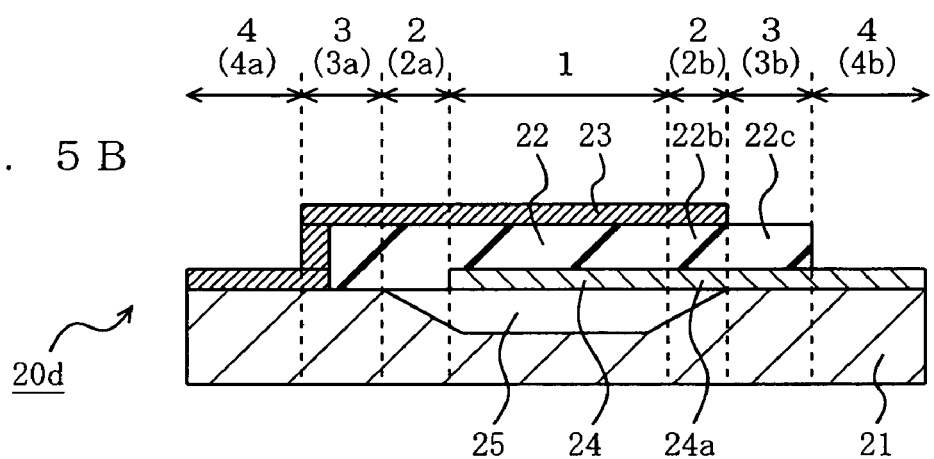
FIG. 5B is a view showing a second example of the cross-section of the piezoelectric element 20d of the third embodiment.

FIG. 5B is a view showing a second example of the cross-section of the piezoelectric element 20d of the third embodiment. As shown in FIG. 5B, the upper electrode layer 23 does not have to extend up to a portion above the portion 22c of the piezoelectric layer 22 that extends up to the periphery of the cavity portion 25. By making the upper electrode layer 23 short in this manner, the area in which the upper electrode layer 23 opposes the lower electrode layer 24 can be adjusted, and the capacitance of the capacitor can be adjusted.

Figure 5C:
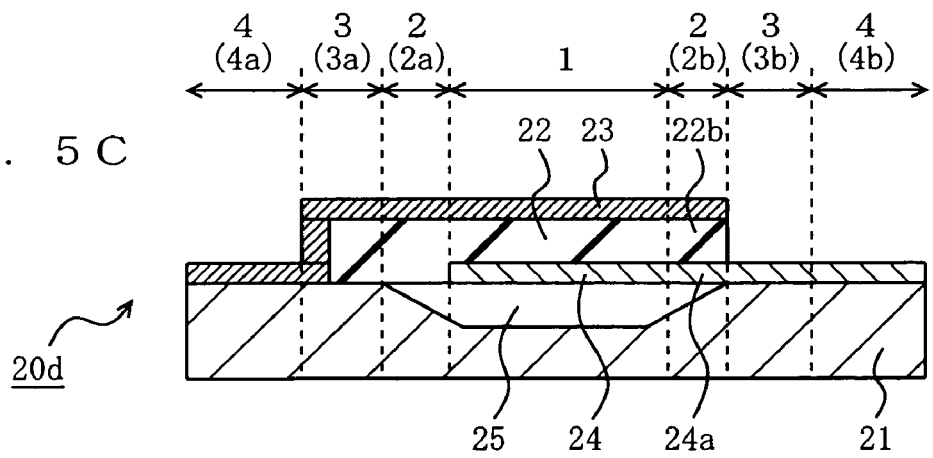
FIG. 5C is a view showing a third example of the cross-section of the piezoelectric element 20d of the third embodiment.

FIG. 5C is a view showing a third example of the cross-section of the piezoelectric element 20d of the third embodiment. As shown in FIG. 5C, the piezoelectric layer 22 does not have to extend up to the periphery of the cavity portion 25.

Figure 5D:
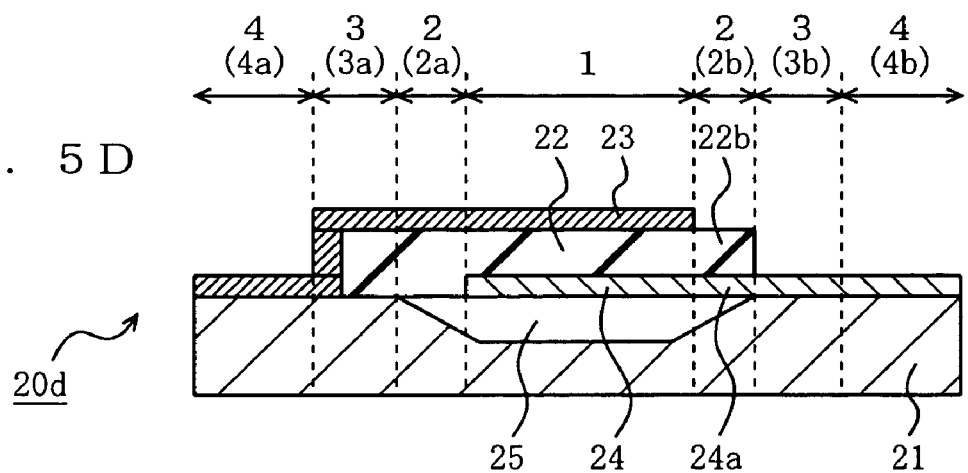
FIG. 5D is a view showing a fourth example of the cross-section of the piezoelectric element 20d of the third embodiment.

FIG. 5D is a view showing a fourth example of the cross-section of the piezoelectric element 20d of the third embodiment. As shown in FIG. 5D, the upper electrode layer 23 does not have to extend up to the second bridging portion 2b. In other words, the second bridging portion 2b can be formed only with the extended portion 22b of the piezoelectric layer 22 and the extended portion 24a of the lower electrode layer 24.

Figure 5E:
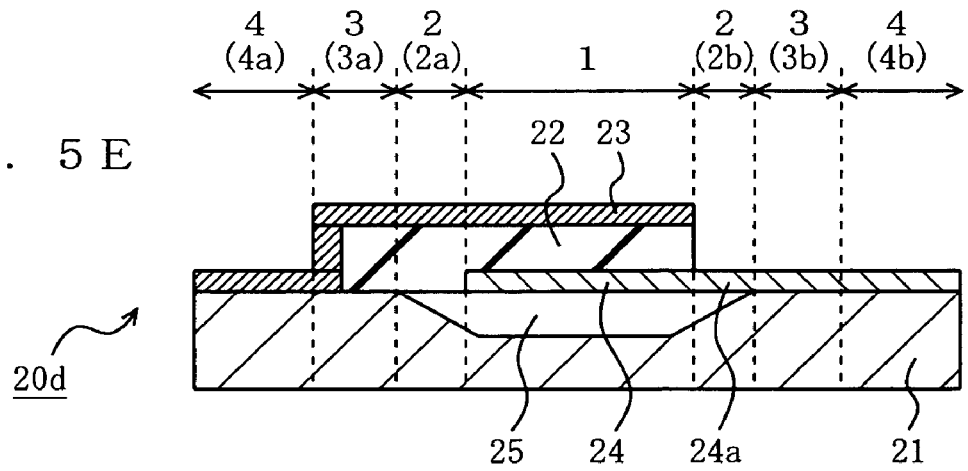
FIG. 5E is a view showing a fifth example of the cross-section of the piezoelectric element 20d of the third embodiment.

FIG. 5E is a view showing a fifth example of the cross-section of the piezoelectric element 20d of the third embodiment. As shown in FIG. 5E, the upper electrode layer 23 and the piezoelectric layer 22 do not have to extend up to the second bridging portion 2b. In other words, the second bridging portion 2b can be formed only with the extended portion 24a of the lower electrode layer 24.

In this manner, at least one layer selected from a group consisting of the lower electrode layer, the piezoelectric layer, and the upper electrode layer is formed so as to extend up to at least a portion of the periphery of the cavity portion, so that the mechanical strength and the capacitance can be adjusted.

In FIGS. 5B, 5C, 5D and 5E, the lower electrode layer 24 may be formed so as to straddle the cavity portion 25, as shown in FIG. 5A.

Fourth Embodiment

The fourth embodiment of the present invention is a variant example of the second embodiment of the present invention.

Figure 6A:
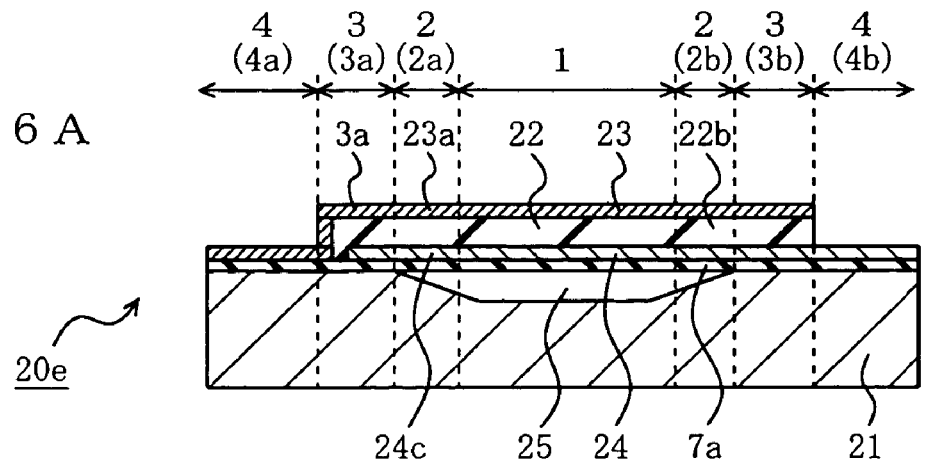
FIG. 6A is a view showing a first example of the cross-section of the piezoelectric element 20e of a fourth embodiment.

FIG. 6A is a view showing a first example of the cross-section of the piezoelectric element 20e of the fourth embodiment. In the second embodiment, as shown in FIG. 4B, the lower electrode layer 24 does not straddle the cavity portion 25. On the other hand, in the first example of the fourth embodiment, as shown in FIG. 6A, the lower electrode layer 24 includes a portion 24c. In other words, the lower electrode layer 24 is formed so as to straddle the cavity portion 25. With this configuration, the mechanical strength of the first bridging portion 2a can be increased.

Figure 6B:
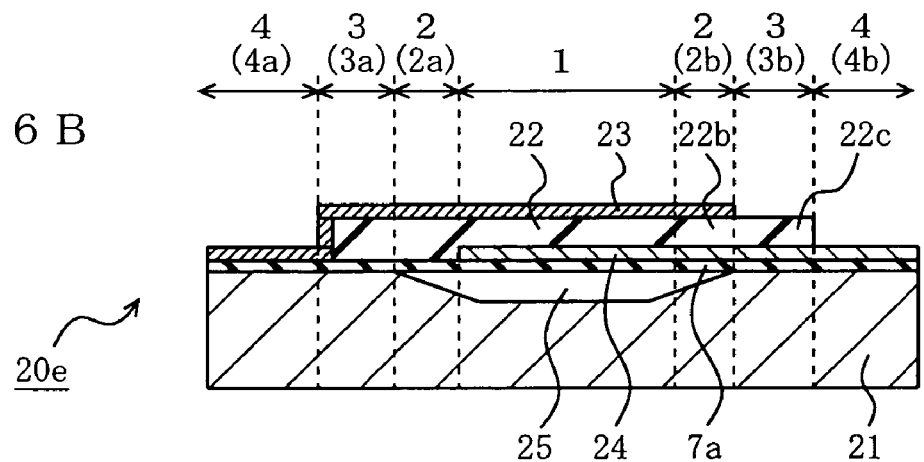
FIG. 6B is a view showing a second example of the cross-section of the piezoelectric element 20e of the fourth embodiment.

FIG. 6B is a view showing a second example of the cross-section of the piezoelectric element 20e of the fourth embodiment. As shown in FIG. 6B, the upper electrode layer 23 does not have to extend up to a portion above the portion 22c of the piezoelectric layer 22 that extends up to the periphery of the cavity portion 25. By making the upper electrode layer 23 short in this manner, the area in which the upper electrode layer 23 opposes the lower electrode layer 24 can be adjusted, and the capacitance of the capacitor can be adjusted precisely.

Figure 6C:
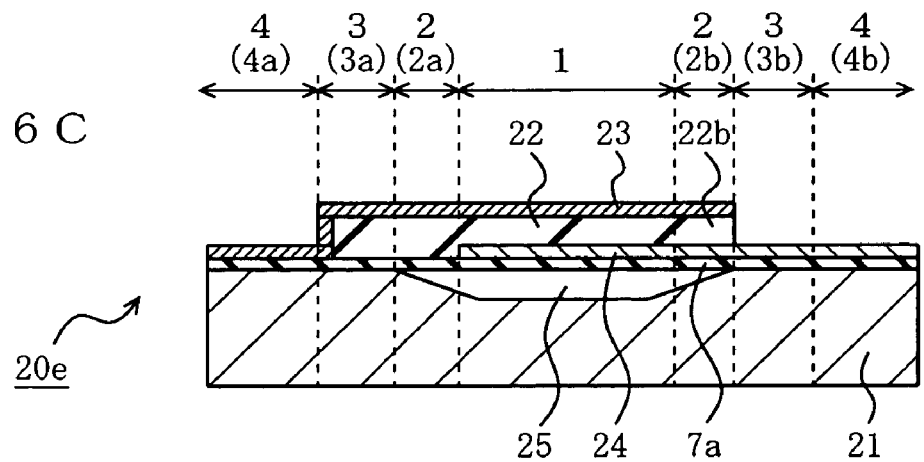
FIG. 6C is a view showing a third example of the cross-section of the piezoelectric element 20e of the fourth embodiment.

FIG. 6C is a view showing a third example of the cross-section of the piezoelectric element 20e of the fourth embodiment. As shown in FIG. 6C, the piezoelectric layer 22 does not have to extend up to the periphery of the cavity portion 25.

Figure 6D:
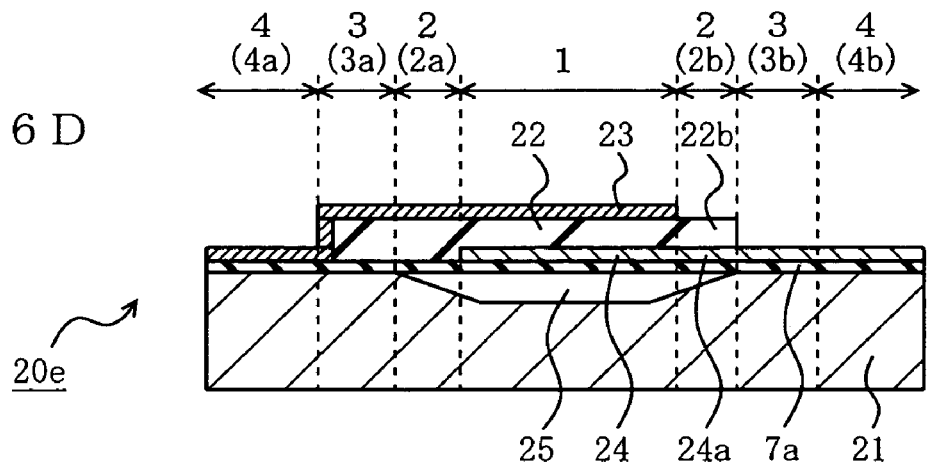
FIG. 6D is a view showing a fourth example of the cross-section of the piezoelectric element 20e of the fourth embodiment.

FIG. 6D is a view showing a fourth example of the cross-section of the piezoelectric element 20e of the fourth embodiment. As shown in FIG. 6D, the upper electrode layer 23 does not have to extend up to the second bridging portion 2b. In other words, the second bridging portion 2b can be formed only with the extended portion 22b of the piezoelectric layer 22 and the extended portion 24a of the lower electrode layer 24.

Figure 6E:
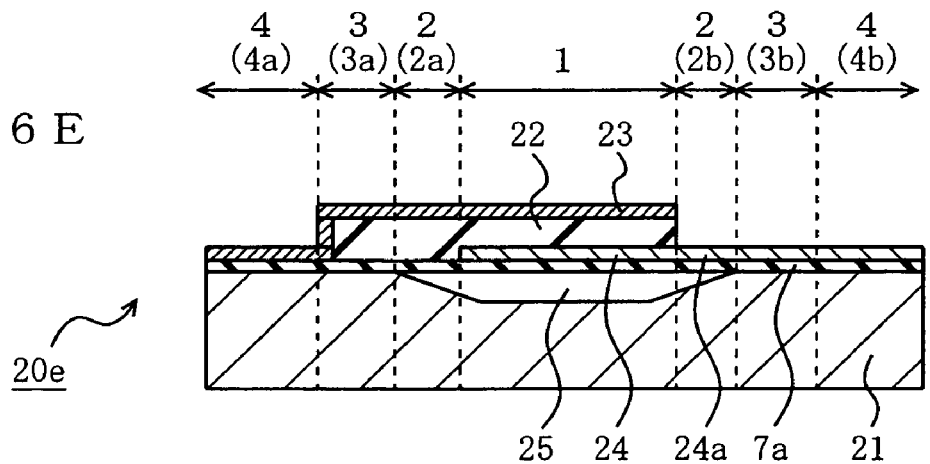
FIG. 6E is a view showing a fifth example of the cross-section of the piezoelectric element 20e of the fourth embodiment.

FIG. 6E is a view showing a fifth example of the cross-section of the piezoelectric element 20e of the fourth embodiment. As shown in FIG. 6E, the upper electrode layer 23 and the piezoelectric layer 22 do not have to extend up to the second bridging portion 2b. In other words, the second bridging portion 2b can be formed only with the extended portion 24a of the lower electrode layer 24.

In this manner, at least one layer selected from a group consisting of the lower electrode layer, the piezoelectric layer, the upper electrode layer and the dielectric layer is formed so as to extend up to at least a portion of the periphery of the cavity portion, so that the mechanical strength and the capacitance can be adjusted.

In FIGS. 6B, 6C, 6D and 6E, the lower electrode layer 24 may be formed so as to straddle the cavity portion 25, as shown in FIG. 6A.

Fifth Embodiment

The fifth embodiment of the present invention shows variant examples in which the shape of the piezoelectric vibrating portion in the first embodiment of the present invention is variously modified.

Figure 7A:
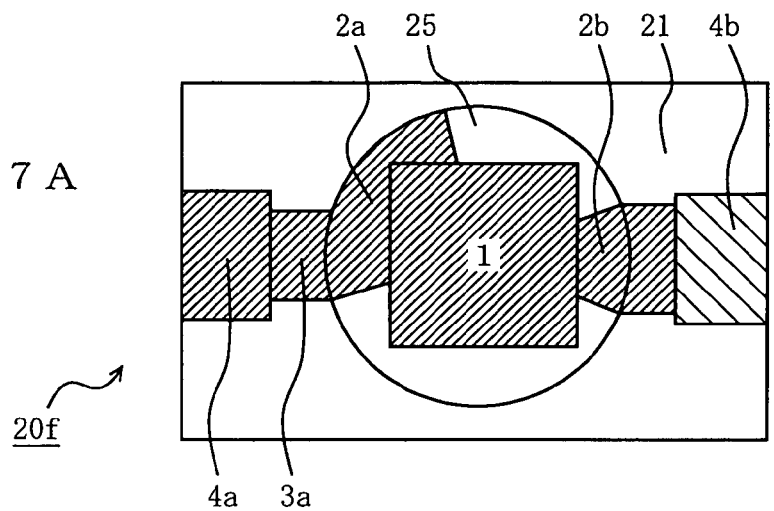
FIG. 7A is a top view showing a piezoelectric element 20f in which the piezoelectric vibrating portion 1 is rectangular.

FIG. 7A is a top view showing a piezoelectric element 20f in which the piezoelectric vibrating portion 1 is rectangular. As shown in FIG. 7A, the piezoelectric vibrating portion 1 does not have to be circular, but may be rectangular. The piezoelectric element 20f with this feature also can provide the same effect as in the first embodiment.

Figure 7B:
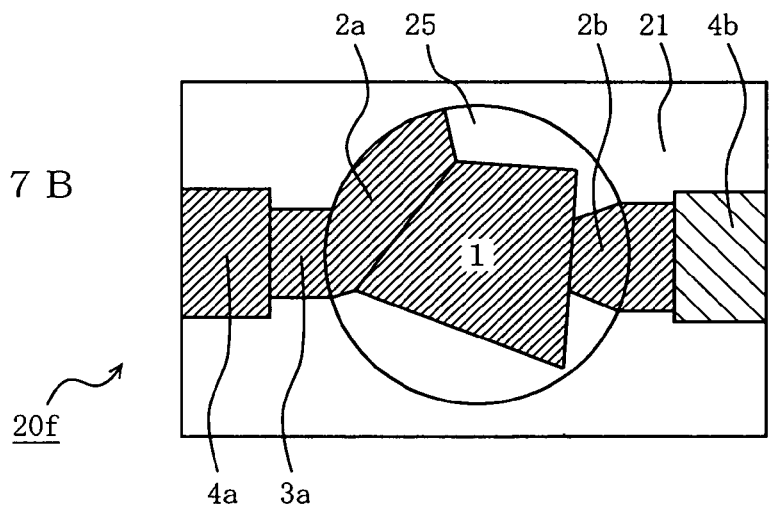
FIG. 7B is a top view showing the piezoelectric element 20f in which the piezoelectric vibrating portion 1 is inequilateral nonparallel polygonal.

FIG. 7B is a top view showing the piezoelectric element 20f in which the piezoelectric vibrating portion 1 is an inequilateral nonparallel polygon. As shown in FIG. 7B, the piezoelectric vibrating portion 1 may be an inequilateral nonparallel polygon having a plurality of sides that are not equal to each other and are not parallel to each other. The piezoelectric element 20f with this feature also can provide the same effect as in the first embodiment.

Figure 7C:
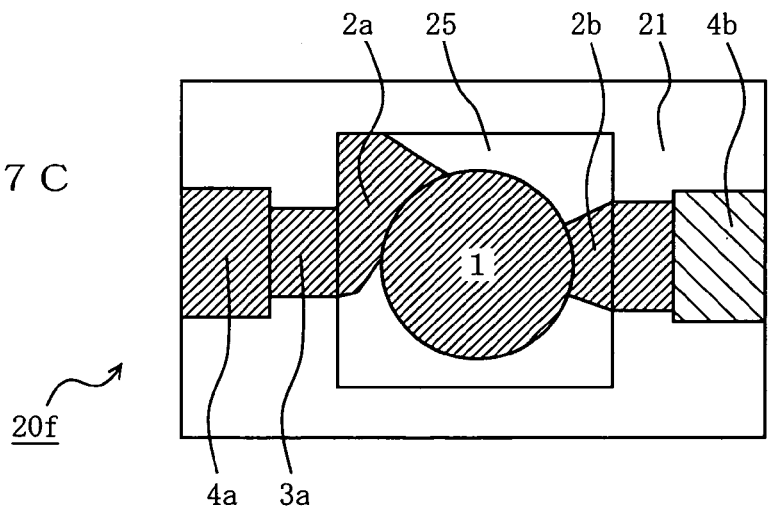
FIG. 7C is a top view showing the piezoelectric element 20f in which the shape of a cavity portion 25 viewed from above is rectangular.

In the piezoelectric element 20 of the first embodiment, the shape of the cavity portion 25 viewed from above is circular, but the present invention is not limited thereto. FIG. 7C is a top view showing the piezoelectric element 20f in which the shape of a cavity portion 25 viewed from above is rectangular. As shown in FIG. 7C, the shape of a cavity portion 25 viewed from above maybe rectangular. Furthermore, the shape of a cavity portion 25 may be an inequilateral nonparallel polygon, instead of being circular or rectangular.

Sixth Embodiment

Figure 8A:
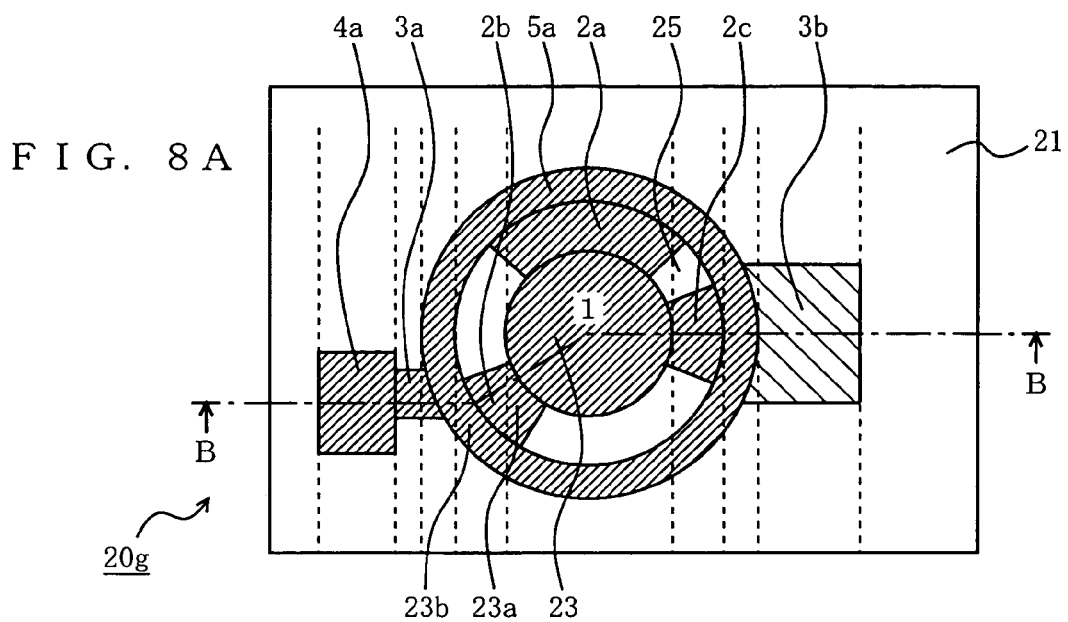
FIG. 8A is a top view showing a piezoelectric element 20g of a sixth embodiment of the present invention.
Figure 8B:
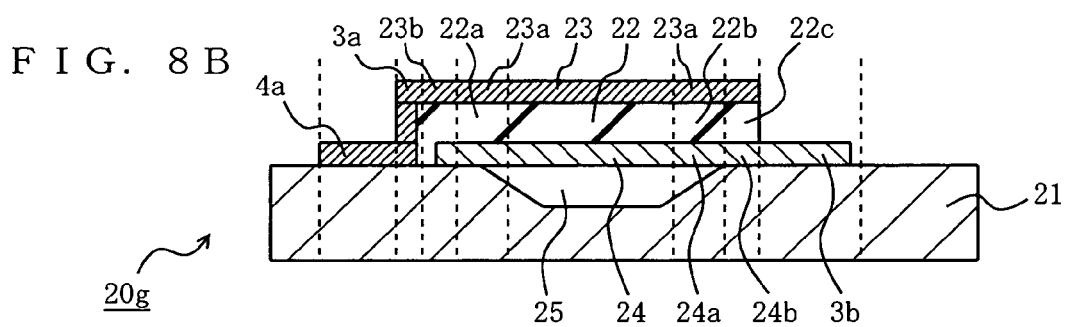
FIG. 8B is a cross-sectional view taken along the line B-B in FIG. 8A of the piezoelectric element 20g of the sixth embodiment.
Figure 8C:
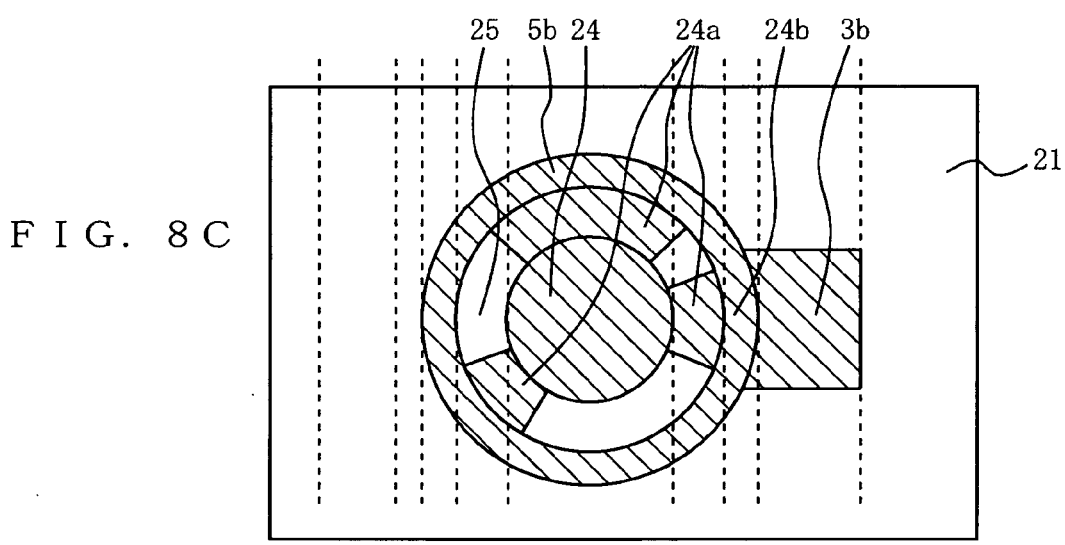
FIG. 8C is a plan view of an extracted portion of a lower electrode layer and its vicinity.

FIG. 8A is a top view showing a piezoelectric element 20g of a sixth embodiment of the present invention. FIG. 8B is a cross-sectional view taken along the line B-B in FIG. 8A of the piezoelectric element 20g of the sixth embodiment. FIG. 8C is a plan view of an extracted portion of a lower electrode layer and its vicinity.

As shown in FIGS. 8A, 8B and 8C, in the sixth embodiment, the piezoelectric element 20g includes first, second and third bridging portions 2a, 2b and 2c. The first, second and third bridging portions 2a, 2b and 2c are formed so as not to be line-symmetric with respect to any line segment traversing the piezoelectric vibrating portion 1 and/or so as not to be point-symmetric with respect to any point in the piezoelectric vibrating portion 1 in the projection of the piezoelectric vibrating portion 1 in the laminating direction. Therefore, spurious responses caused by symmetry of the supporting portions can be suppressed.

Of the first, second and third bridging portions 2a, 2b and 2c, for example, the second bridging portion 2b includes an extended portion 23a of the upper electrode layer 23. The third bridging portion 2c includes an extended portion 24a of the lower electrode layer 24. A first wiring electrode 3a is provided on the end portion of the piezoelectric layer 22. One end of the first wiring electrode 3a is connected to a first terminal electrode 4a for receiving and sending electrical signals to the upper electrode layer 23. A second wiring electrode 3b is provided on the substrate 21. One end of the second wiring electrode 3b is connected to a second terminal electrode (not shown) for receiving and sending electrical signals to the lower electrode layer 24.

The piezoelectric element 20g further includes a first relay electrode 5a electrically connected to the upper electrode layer 23 extending up to the periphery of the cavity portion 25 via the first, second and third bridging portions 2a, 2b and 2c. The first relay electrode 5a is formed with a portion 23b further extended from the extended portion 23a of the upper electrode layer 23. The side face on the internal side of the first relay electrode 5a is electrically connected to the extended portion 23a of the upper electrode layer 23. The side face on the external side of the first relay electrode 5a is electrically connected to the other end of the first wiring electrode 3a. The first relay electrode 5a is provided in a ring-shape along the periphery of the cavity portion 25 so that the above-described connection relationship can be obtained. The first relay electrode 5a (23b) serves to relay electrical signals applied from the first wiring electrode 3a to the upper electrode layer 23 via the extended portion 23a of the upper electrode layer 23.

The piezoelectric element 20g further includes a second relay electrode 5b electrically connected to the lower electrode layer 24 extending up to the periphery of the cavity portion 25 via the first, second and third bridging portions 2a, 2b and 2c. The second relay electrode 5b is formed in a ring-shape along the periphery of the cavity portion 25, overlapping with the first relay electrode 5a below the first relay electrode 5a in the projection of the piezoelectric vibrating portion 1 in the laminating direction. The second relay electrode 5b is formed with a portion 24b further extended from the extended portions 24a of the lower electrode layer 24. The side face on the internal side of the second relay electrode 5b (24b) is electrically connected to the extended portions 24a of the lower electrode layer 24. The side face on the external side of the second relay electrode 5b (24b) is electrically connected to the other end of the second wiring electrode 3b. Thus, the second relay electrode 5b (24b) serves to relay electrical signals applied from the second wiring electrode 3b to the lower electrode layer 24 via the extended portions 24a of the lower electrode layer 24.

Figure 9:
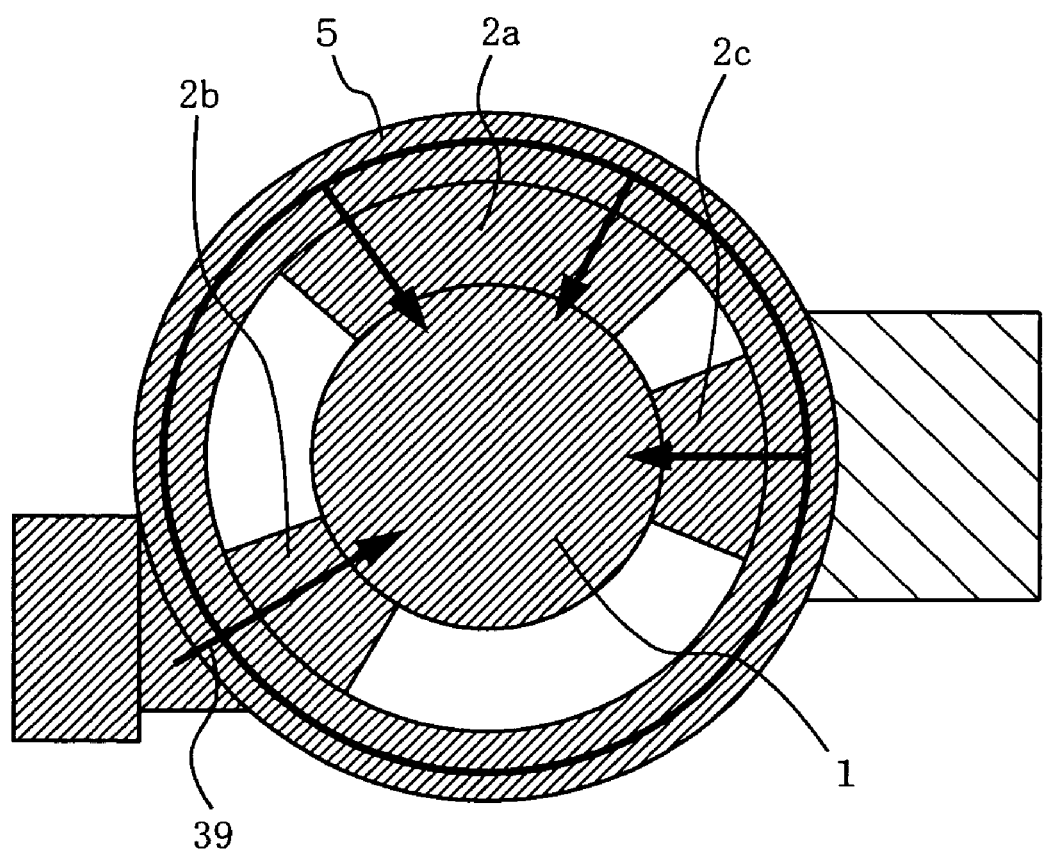
FIG. 9 is a view for illustrating the effect of providing first and second relay electrodes 5a and 5b.

FIG. 9 is a view for illustrating the effect of providing the first and second relay electrodes 5a and 5b. By providing the first and second relay electrodes 5 (5a and 5b), the effect that an input voltage 39 can be applied uniformly to the piezoelectric vibrating portion 1 via the three bridging portions 2a, 2b and 2c that are arranged around the piezoelectric vibrating portion 1, as shown in FIG. 9, can be provided.

In the piezoelectric element 20g of the sixth embodiment, as shown in FIG. 8B, the first, second and third bridging portions 2a, 2b and 2c are formed with the extended portions 23a and 23b of the upper electrode layer 23 and the extended portions 24a of the lower electrode layer 24 that overlap with each other in the vertical direction, with the extended portion 22a and 22b of the piezoelectric layer 22 interposed therebetween, respectively. These portions form new capacitors.

Furthermore, the first relay electrode 5a and the second relay electrode 5b are formed, overlapping with each other in the vertical direction with the extended portion 22c of the piezoelectric layer 22 interposed therebetween. Therefore, these portions also form a new capacitor.

The equivalent circuit diagram of a piezoelectric element of the sixth embodiment basically corresponds to that of FIG. 26B. However, the capacitance of these newly formed capacitors can be adjusted by adjusting the degree of the overlapping of the upper electrode layer and the lower electrode layer or the degree of the overlapping of the first and the second relay electrodes. Thus, a new effect that the capacitance of the piezoelectric element can be adjusted can also be provided.

In the sixth embodiment, the shape of the first and the second relay electrodes 5a and 5b viewed from above is a circle, which corresponds to the shape of the piezoelectric vibrating portion 1, but the shape of the first relay electrode 5a and the second relay electrode 5b is not limited thereto. The shape of the first relay electrode 5a and the second relay electrode 5b is not limited by the shape of the piezoelectric vibrating portion, but can be any other shape as desired, such as a rectangle.

Figure 10A:
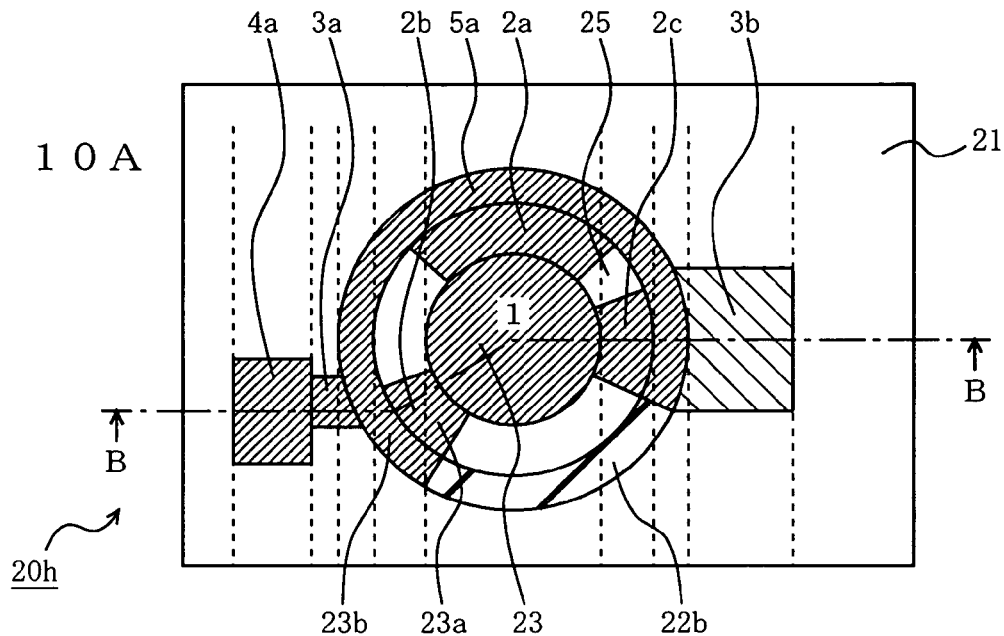
FIG. 10A is a top view showing a piezoelectric element 20h of a variant example of the sixth embodiment.
Figure 10B:
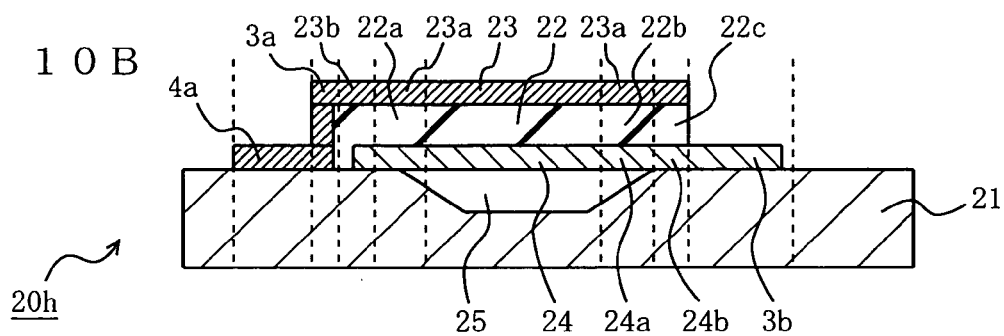
FIG. 10B is a cross-sectional view taken along the line B-B in FIG. 10A of the piezoelectric element 20h.
Figure 10C:
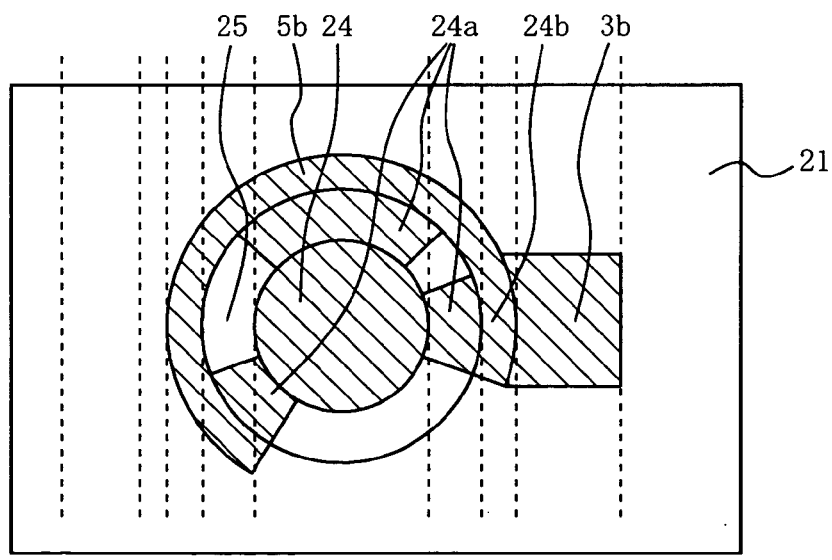
FIG. 10C is a plan view of an extracted portion of a lower electrode layer and its vicinity.

FIG. 10A is a top view showing a piezoelectric element 20h of a variant example of the sixth embodiment. FIG. 10B is a cross-sectional view taken along the line B-B in FIG. 10A of the piezoelectric element 20h. FIG. 10C is a plan view of an extracted portion of a lower electrode layer and its vicinity.

In the sixth embodiment, both of the first and the second relay electrodes 5a and 5b have a complete ring-shape, but the present invention is not limited thereto. As shown in FIGS. 10A, 10B and 10C, the first relay electrode 5a may have a notched portion, as long as the first relay electrode is electrically connected to the upper electrode layer 23 extending up to the peripheral portion of the cavity portion 25 via the first, second and third bridging portions 2a, 2b and 2c. Similarly, the second relay electrode 5b may have a notched portion, as long as the second relay electrode is electrically connected to the lower electrode layer 24 extending up to the peripheral portion of the cavity portion 25 via the first, second and third bridging portions 2a, 2b and 2c. Thus, even if the first and the second relay electrodes 5a and 5b are not complete ring-shaped, the same effect can be obtained.

Furthermore, other than a ring-shape, polygonal frame-shapes such as rectangular frame-shapes or frame-shapes with a free curve can be used.

In the above variant example, both of the first and the second relay electrodes 5a and 5b have a notched portion. However, one may be completely ring-shaped. The notched portions of the first and the second relay electrodes 5a and 5b are not necessarily of the same shape.

In the above variant example, the notched portion of the first relay electrode 5a overlaps with the notched portion of the second relay electrode 5b in the vertical direction. However, the positions of the notched portions may be displaced.

Seventh Embodiment

Figure 11A:
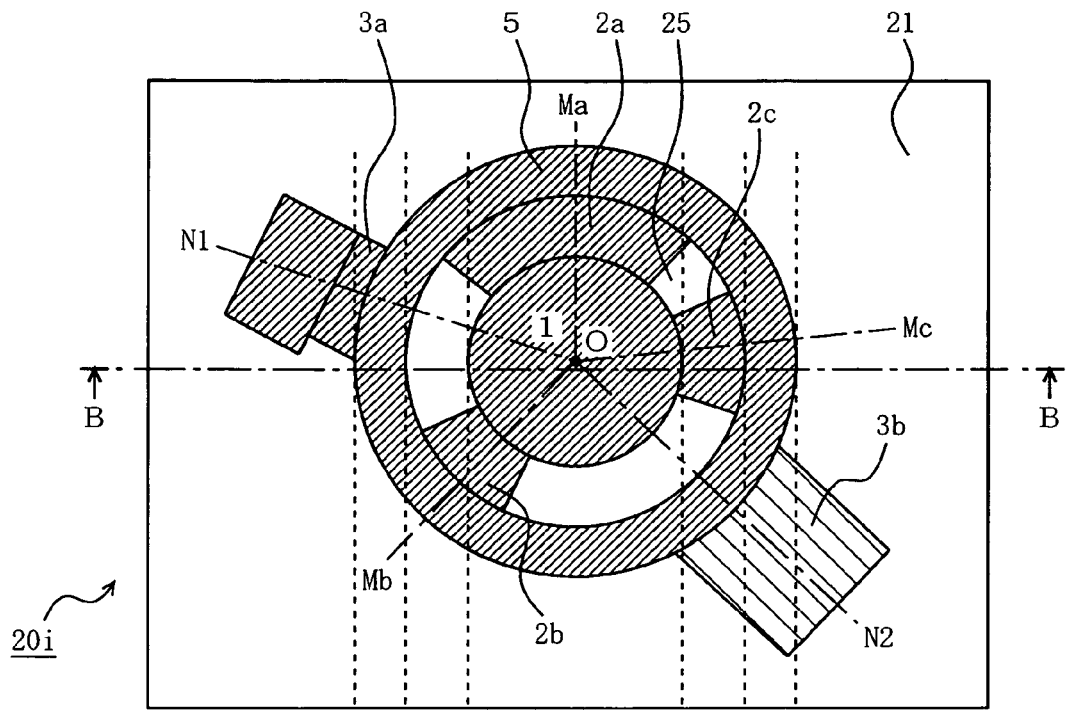
FIG. 11A is a top view showing a piezoelectric element 20i of a seventh embodiment of the present invention.
Figure 11B:
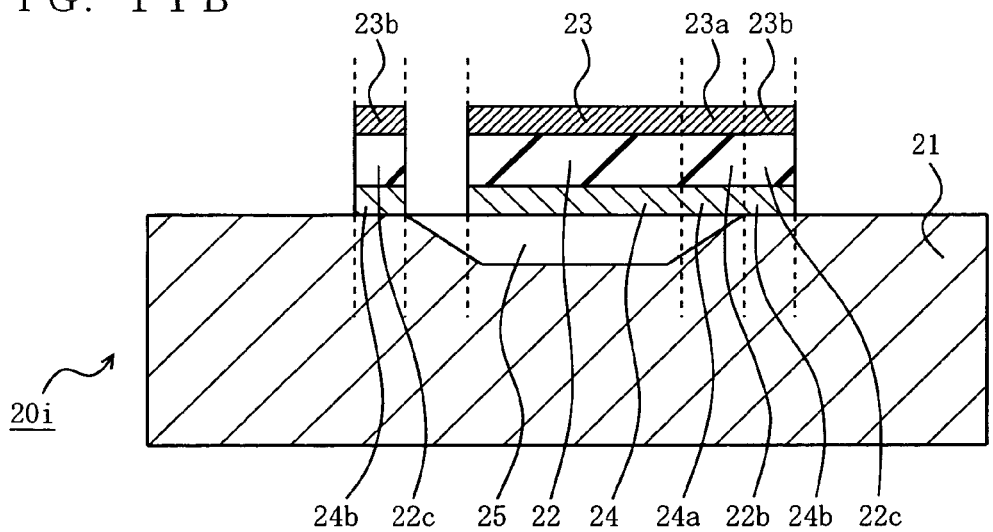
FIG. 11B is a cross-sectional view taken along the line B-B in FIG. 11A of the piezoelectric element 20i.

FIG. 11A is a top view showing a piezoelectric element 20i of a seventh embodiment of the present invention. FIG. 11B is a cross-sectional view taken along the line B-B in FIG. 11A of the piezoelectric element 20i. The piezoelectric element 20i of the seventh embodiment is the same as the piezoelectric element 20g of the sixth embodiment except for the following points.

As shown in FIG. 11A, the first wiring electrode 3a is provided such that three central lines OMa, OMb and OMc connecting the center O of the piezoelectric vibrating portion 1 and the centers of the first, second and third bridging portions 2a, 2b and 2c do not overlap with the central line ON1 connecting the center O of the piezoelectric vibrating portion 1 and the center of the first wiring electrode 3a in the projection of the piezoelectric vibrating portion 1 in the laminating direction. The second wiring electrode 3b is provided such that the central lines OMa, OMb and OMc connecting the center O of the piezoelectric vibrating portion 1 and the centers of the first, second and third bridging portions 2a, 2b and 2c do not overlap with the central line ON2 connecting the center O of the piezoelectric vibrating portion 1 and the center of the second wiring electrode 3b in the projection of the piezoelectric vibrating portion 1 in the laminating direction. This embodiment is different from the sixth embodiment in these two points.

Preferably, the first, second and third bridging portions 2a, 2b and 2c are not arranged between the piezoelectric vibrating portion 1 and the first wiring electrode 3a, and are not arranged between the piezoelectric vibrating portion 1 and the second wiring electrode 3b.

Figure 12A:
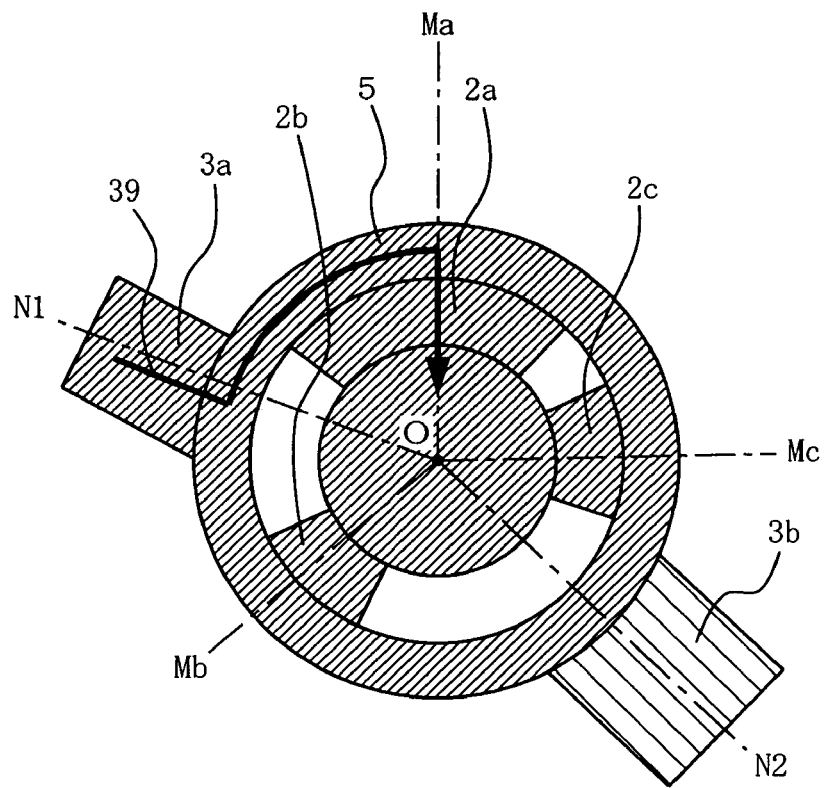
FIG. 12A is a schematic top view of a piezoelectric element in which first to third bridging portions 2a, 2b, and 2c are not arranged between a piezoelectric vibrating portion 1 and a first wiring electrode 3a, and are not arranged between the piezoelectric vibrating portion 1 and a second wiring electrode 3b.

FIG. 12A is a schematic top view of a piezoelectric element in which the first to third bridging portions 2a, 2b, and 2c are not arranged between the piezoelectric vibrating portion 1 and the first wiring electrode 3a, and are not arranged between the piezoelectric vibrating portion 1 and the second wiring electrode 3b.

When the first, second and third bridging portions 2a, 2b and 2c are arranged in the manner shown in FIG. 12A, the input voltage 39 of high power does not enter the piezoelectric vibrating portion 1 from the first wiring electrode 3a at one time. Thus, the breakdown of the piezoelectric element can be prevented. As a result, the rated power of the piezoelectric element can be increased.

Figure 12B:
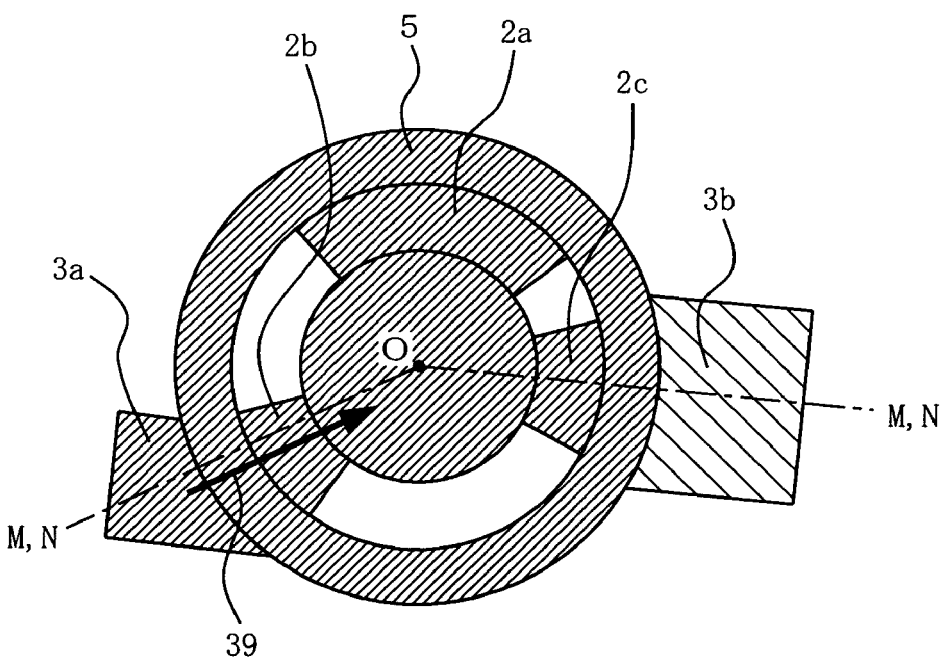
FIG. 12B is a schematic top view of a piezoelectric element in which the second bridging portion 2b is provided between the piezoelectric vibrating portion 1 and the first wiring electrode 3a, and the third bridging portion 2c is provided between the piezoelectric vibrating portion 1 and the second wiring electrode 3b.

FIG. 12B is a schematic top view of a piezoelectric element in which the second bridging portion 2b is provided between the piezoelectric vibrating portion 1 and the first wiring electrode 3a, and the third bridging portion 2c is provided between the piezoelectric vibrating portion 1 and the second wiring electrode 3b. As shown in FIG. 12B, when the first wiring electrode 3a is provided such that the central line OMb connecting the center O of the piezoelectric vibrating portion 1 and the center of the second bridging portions 2b is overlapped with the central line ON1 connecting the center O of the piezoelectric vibrating portion 1 and the center of the first wiring electrode 3a, and the second wiring electrode 3b is provided such that the central line OMc connecting the center O of the piezoelectric vibrating portion 1 and the center of the bridging portion 2c is overlapped with the central line ON2 connecting the center O of the piezoelectric vibrating portion 1 and the center of the second wiring electrode 3b, then the input voltage 39 of high power enters the piezoelectric vibrating portion 1 from the first and the second wiring electrodes 3a and 3b at one time. Thus, breakdown of the piezoelectric element may occur.

Thus, in the seventh embodiment, breakdown of the piezoelectric element can be prevented.

Eight Embodiment

Figure 13A:
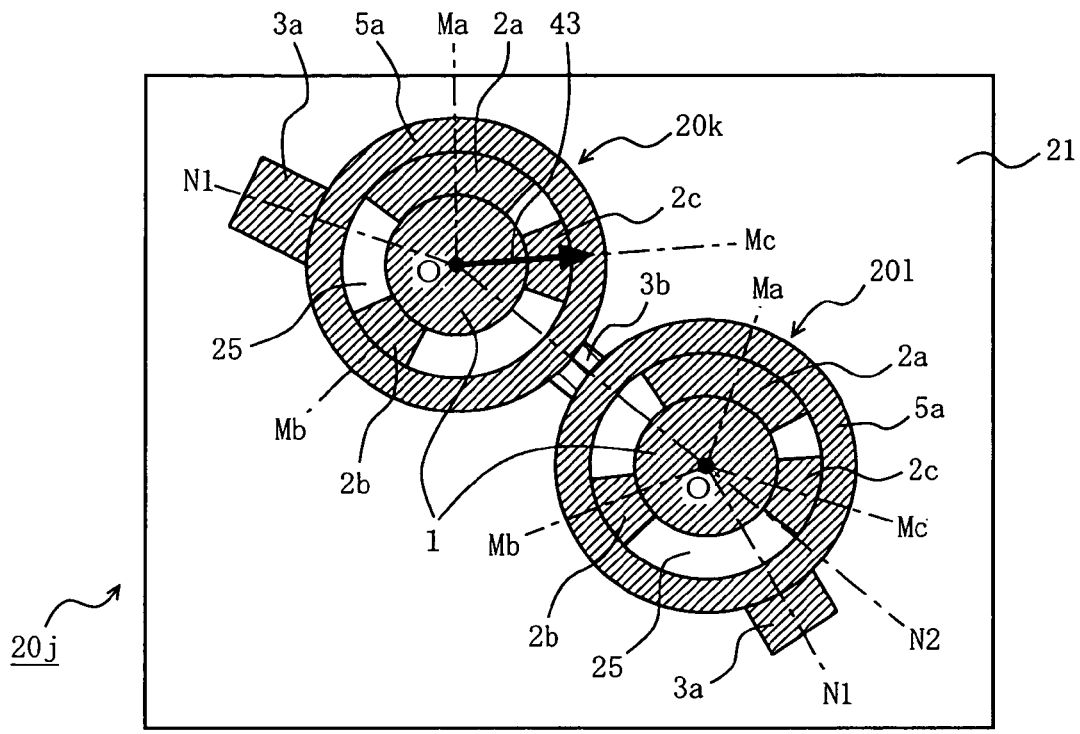
FIG. 13A is a top view showing a composite piezoelectric element 20j of an eighth embodiment of the present invention.

FIG. 13A is a top view showing a composite piezoelectric element 20j of an eighth embodiment of the present invention. The composite piezoelectric element 20j of the eighth embodiment is a filter. The composite piezoelectric element 20j includes at least two piezoelectric elements 20k and 20l that have different resonant frequencies or the same resonant frequency. The piezoelectric elements 20k and 20l are connected by integrating or coupling the respective wiring electrodes 3b so that the respective lower electrode layers are electrically connected. The piezoelectric elements 20k and 20l are piezoelectric elements, for example, as shown in FIGS. 8A or 11A. The configurations of the piezoelectric elements 20k and 20l already have been described with reference to FIGS. 8A and 11A and therefore will not be further described.

In the piezoelectric element 20j of the eighth embodiment, each of the piezoelectric vibrating portions 1 is provided above a cavity portion 25. Each of the piezoelectric vibrating portions 1 is supported at three portions by a first, second the third bridging portion 2a, 2b and 2c with the substrate 21. Therefore, each of the piezoelectric vibrating portions 1 vibrates in a manner close to free vibration. Thus, the effective electromechanical coupling factor is increased.

The first, second and third bridging portions 2a, 2b and 2c are formed so as not to be line-symmetric with respect to any line segment traversing the piezoelectric vibrating portion 1 and/or so as not to be point-symmetric with respect to any point in the piezoelectric vibrating portion 1 in the projection of the piezoelectric vibrating portion 1 in the laminating direction. Therefore, spurious responses caused by the symmetry of the supporting portions can be suppressed.

In the piezoelectric elements 20k and 20l, the first and the second wiring electrodes 3a and 3b are provided such that three central lines OMa, OMb and OMc connecting the center O of the piezoelectric vibrating portion 1 and the centers of the bridging portions 2a, 2b and 2c do not overlap with the central lines ON1 and ON2 connecting the center O of the piezoelectric vibrating portion 1 and the centers of the first and the second wiring electrodes 3a and 3b in the projection of the piezoelectric vibrating portion 1 in the laminating direction. Therefore, a vibration 43 that has leaked from the piezoelectric vibrating portion 1 does not propagate to the neighboring piezoelectric vibrating portion 1. Therefore, spurious responses caused by the propagation of the vibration 43 leaking from the adjacent piezoelectric element cannot be generated. As a result, the composite piezoelectric element of the eighth embodiment has no interference of unwanted vibrations propagating in the laterally propagating acoustic wave mode, and constitutes a filter having good frequency characteristics.

Figure 13B:
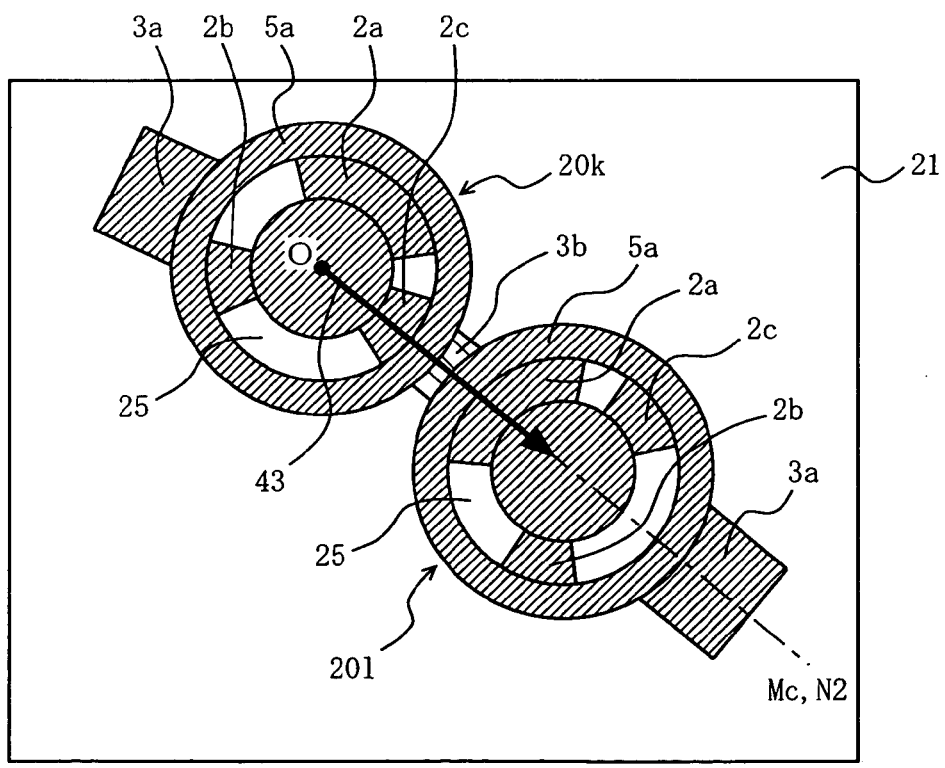
FIG. 13B is a top view of a composite piezoelectric element as a comparative example for illustrating the effect of the composite piezoelectric element shown in FIG. 13A.

FIG. 13B is a top view of a composite piezoelectric element as a comparative example for illustrating the effect of the composite piezoelectric element shown in FIG. 13A. As shown in FIG. 13B, the second wiring electrode 3b is provided such that the central line OMc connecting the center O of the piezoelectric vibrating portion 1 and the center of the third bridging portion 2c is overlapped with the central line ON2 connecting the center of the piezoelectric vibrating portion 1 and the center of the second wiring electrode 3b in the projection of the piezoelectric vibrating portion 1 in the laminating direction. With this arrangement, the vibration 43 that has leaked from the piezoelectric vibrating portion 1 of the piezoelectric element 20k propagates to the piezoelectric vibrating portion 1 of the neighboring piezoelectric element 20l. In this case, unwanted vibration modes interfere with each other between the adjacent resonators, and spurious responses occur. In the composite piezoelectric element shown in FIG. 13A, such a problem is overcome.

However, even in the composite piezoelectric element having an arrangement as shown in FIG. 13B, if the resonant frequency of the piezoelectric element 20k is equal to the resonant frequency of the piezoelectric element 20l, and the phases thereof are opposite, then unwanted vibrations propagating in the laterally propagating acoustic wave mode are cancelled by each other. Therefore, spurious responses are suppressed so that the composite piezoelectric element as shown in FIG. 13B is also effective.

Figure 14:
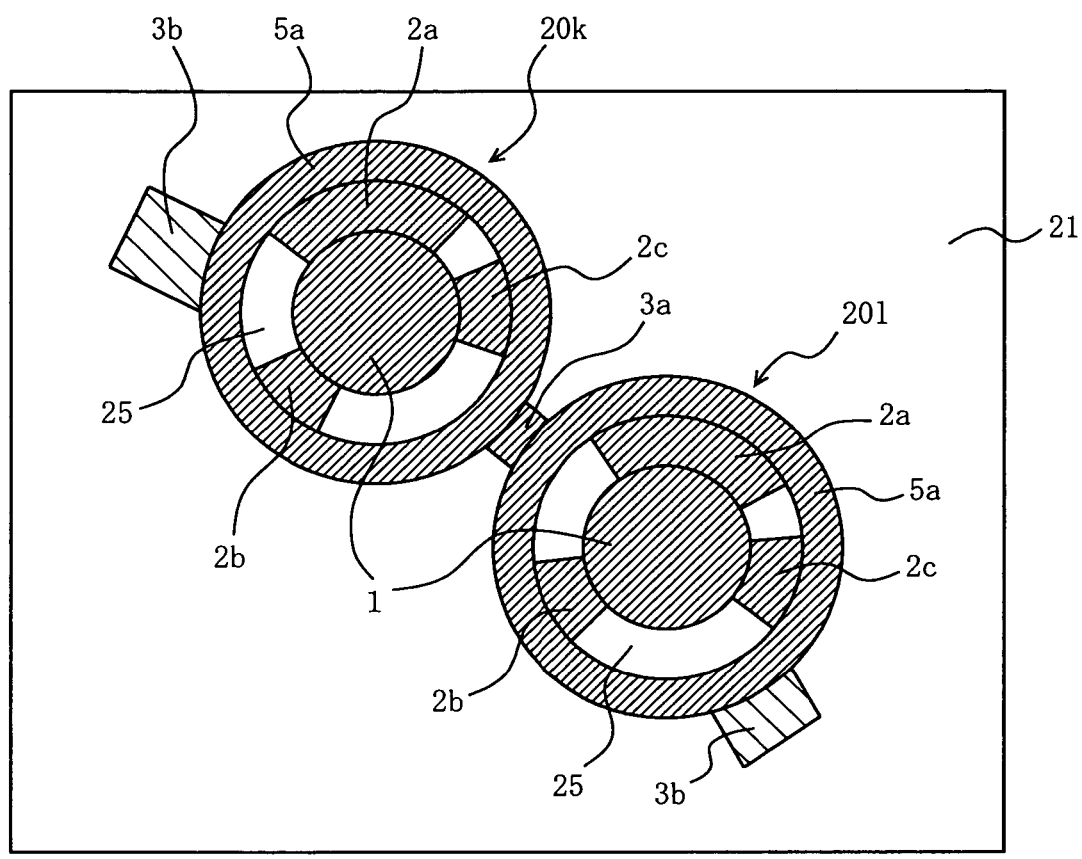
FIG. 14 is a top view of a composite piezoelectric element constituted by integrating or coupling the first wiring electrodes 3a connected to an upper electrode layer.

It should be noted that in the eighth embodiment, the composite piezoelectric element is constituted by connecting the piezoelectric elements 20k and 20l by integrating or coupling the second wiring electrodes 3b connected to the lower electrode layers. However, the present invention is not limited thereto. FIG. 14 is a top view of a composite piezoelectric element constituted by integrating or coupling the first wiring electrodes 3a connected to the upper electrode layer. As shown in FIG. 14, the piezoelectric elements 20k and 20l may be electrically connected by integrating or coupling the wiring electrodes 3a electrically connected to the upper electrode layer via the relay electrodes 5a.

Figure 15A:
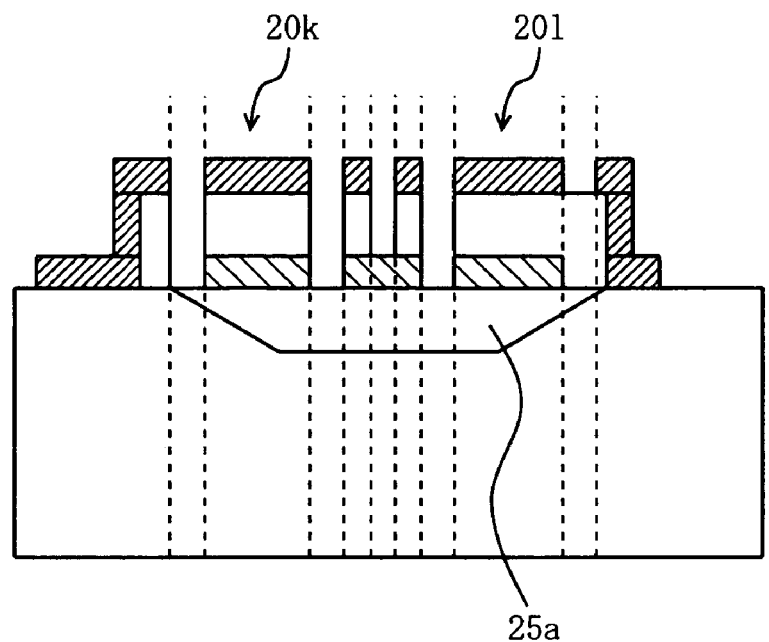
FIG. 15A is a cross-sectional view of a composite piezoelectric element in which a cavity portion is provided so as to be shared by two piezoelectric elements.
Figure 15B:
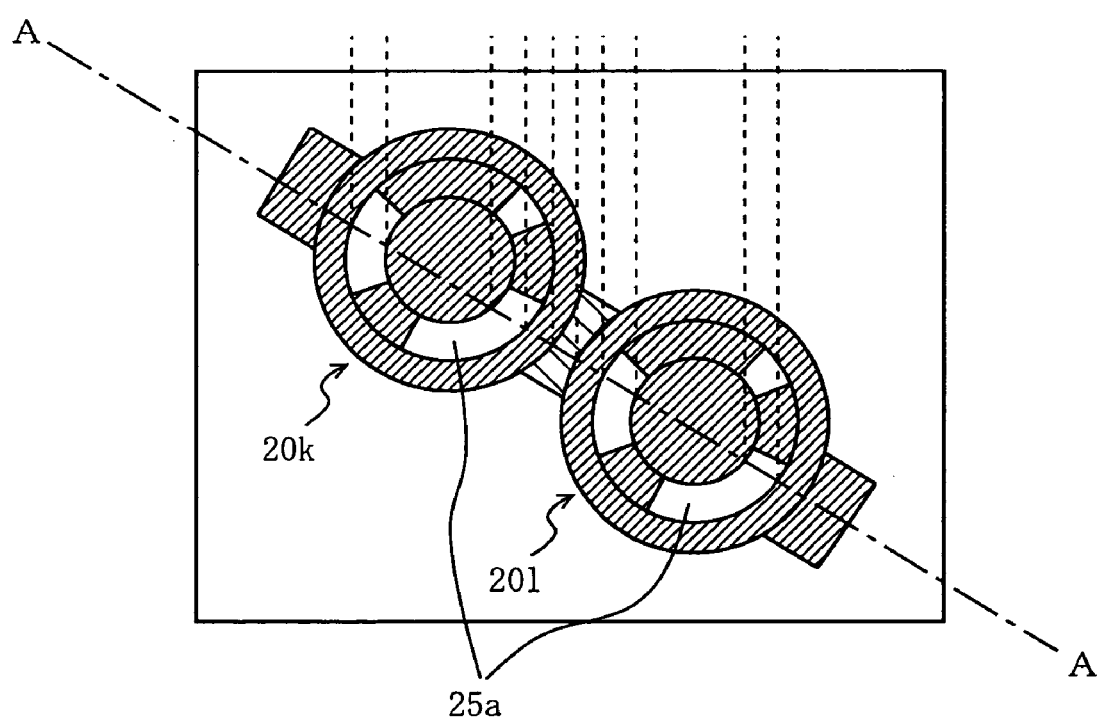
FIG. 15B is a top view of a composite piezoelectric element in which a cavity portion is provided so as to be shared by two piezoelectric elements.

In the eighth embodiment, the cavity portion constituting the composite piezoelectric element is provided for every piezoelectric element. However, the cavity portion can be provided so as to be shared by the piezoelectric elements. FIG. 15A is a cross-sectional view of a composite piezoelectric element in which a cavity portion to be shared by the piezoelectric elements is provided. FIG. 15B is a top view of a composite piezoelectric element in which a cavity portion to be shared by two piezoelectric elements is provided. As shown in FIGS. 15A and 15B, a cavity portion 25a to be shared by the piezoelectric elements 20k and 20l can be provided.

In the eighth embodiment, the composite piezoelectric element is constituted by two piezoelectric elements, but can be constituted by at least three piezoelectric elements. When a cavity portion to be shared is provided, a cavity portion can be shared by all the piezoelectric elements, or can be shared by a part of the piezoelectric elements.

In the eighth embodiment, it is sufficient that any one of the piezoelectric elements is the piezoelectric element of the present invention.

Ninth Embodiment

In the eighth embodiment, a composite piezoelectric element is constituted by using piezoelectric elements having ring-shaped relay electrodes. However, the present invention is not limited thereto. In the ninth embodiment, a composite piezoelectric element may be constituted by using the piezoelectric element of the first embodiment, which has no relay electrode.

Figure 16A:
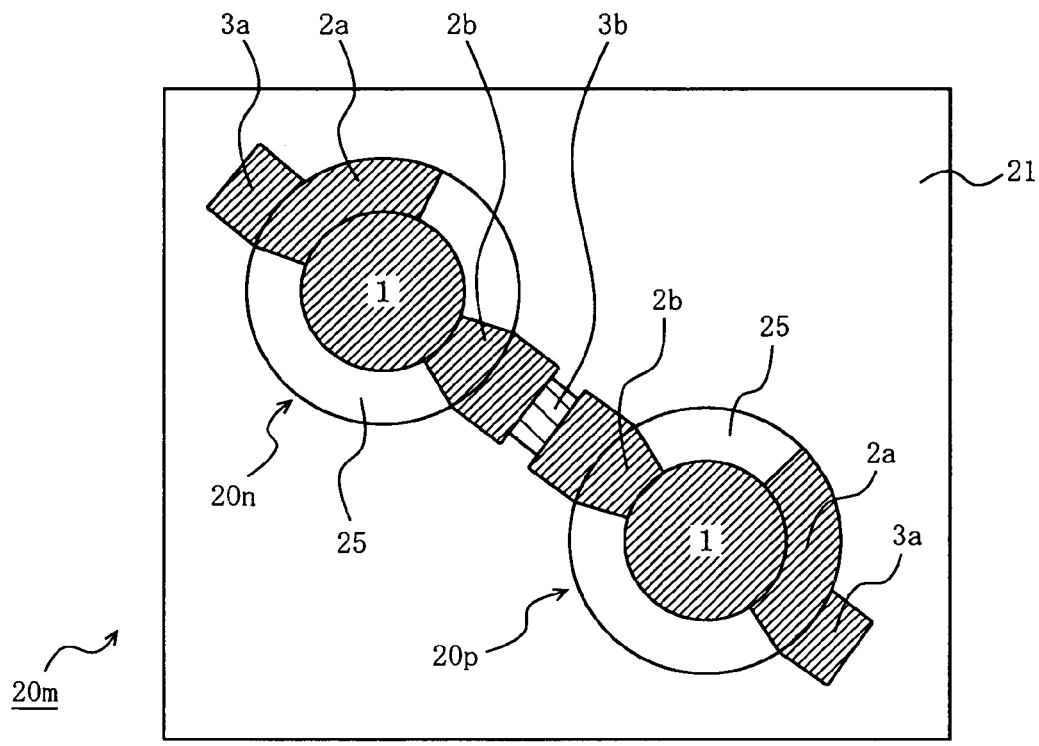
FIG. 16A is a top view showing a composite piezoelectric element 20m of a first example of a ninth embodiment of the present invention.

FIG. 16A is a top view showing a composite piezoelectric element 20m of a first example of the ninth embodiment of the present invention. The composite piezoelectric element 20m is a filter. The composite piezoelectric element 20m includes at least two piezoelectric elements 20n and 20p that have different resonant frequencies or the same resonant frequency. The piezoelectric elements 20n and 20p are connected by integrating or coupling the respective second wiring electrodes 3b electrically connect to the lower electrode layers.

Figure 16B:
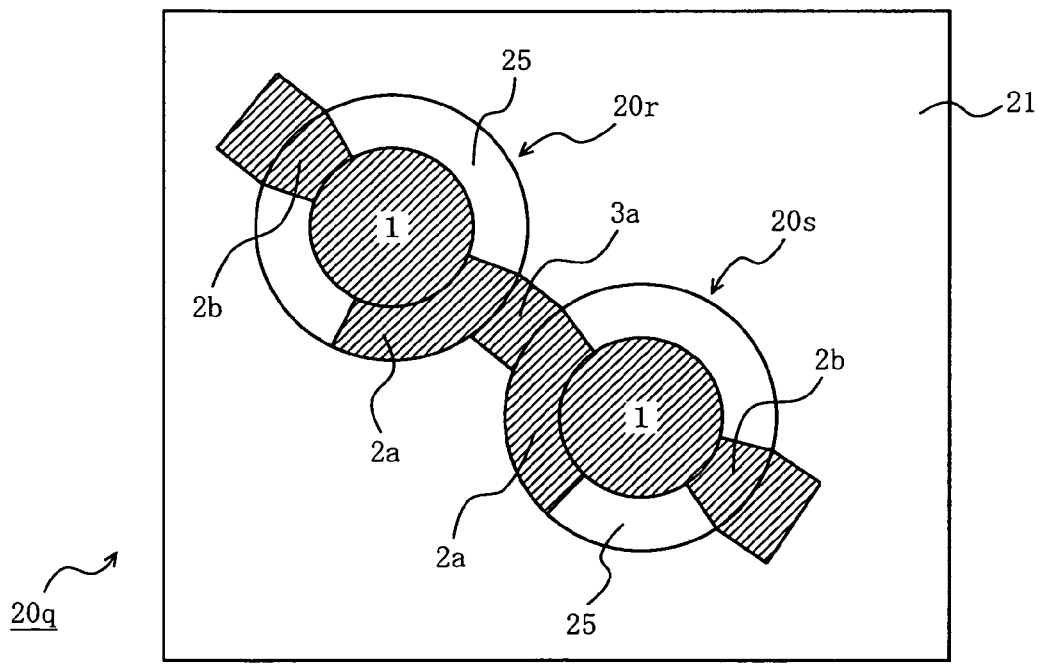
FIG. 16B is a top view showing a composite piezoelectric element 20q of a second example of the ninth embodiment of the present invention.

FIG. 16B is a top view showing a composite piezoelectric element 20q of a second example of the ninth embodiment of the present invention. The composite piezoelectric element 20q is a filter. The composite piezoelectric element 20q includes at least two piezoelectric elements 20r and 20s that have different resonant frequencies or the same resonant frequency. The piezoelectric elements 20r and 20s are connected by integrating or coupling the respective first wiring electrodes 3a electrically connect to the upper electrode layers.

In both of the composite piezoelectric elements shown in FIGS. 16A and 16B, piezoelectric elements in which spurious response are suppressed are used, so that filters having good filter characteristics can be obtained.

In the ninth embodiment, a filter is formed by using a piezoelectric element having a piezoelectric vibrating portion whose shape viewed from above is circular. However, the present invention is not limited thereto. For example, as shown in FIGS. 7A and 7B, a filter may be formed by using a piezoelectric element having a piezoelectric vibrating portion whose shape viewed from above is rectangular or inequilateral nonparallel polygonal. In this case, the same effect can be obtained. Furthermore, as shown in FIG. 7C, the shape of the cavity portion viewed from above may be rectangular or any other desired shape.

In the first to the ninth embodiments, the bridging portions are formed so as not to be line-symmetric with respect to any line segment traversing the piezoelectric vibrating portion and so as not to be point-symmetric with respect to any point in the piezoelectric vibrating portion in the projection of the piezoelectric vibrating portion in the laminating direction. However, in the present invention, as long as the bridging portions are formed so as not to be line-symmetric with respect to any line segment traversing the piezoelectric vibrating portion in the projection of the piezoelectric vibrating portion in the laminating direction, the advantage of the present invention can be obtained even with point symmetry. Similarly, as long as the bridging portions are formed so as not to be point-symmetric with respect to any point in the piezoelectric vibrating portion in the projection of the piezoelectric vibrating portion in the laminating direction, the advantage of the present invention can be obtained even with linear symmetry. In other words, it is sufficient that the bridging portions are formed so as not to be line-symmetric with respect to any line segment traversing the piezoelectric vibrating portion and/or so as not to be point-symmetric with respect to any point in the piezoelectric vibrating portion in the projection of the piezoelectric vibrating portion in the laminating direction.

FIGS. 17, 18, 19, 20, 21 and 22 are views showing variant examples of the bridging portions.

Figure 17:
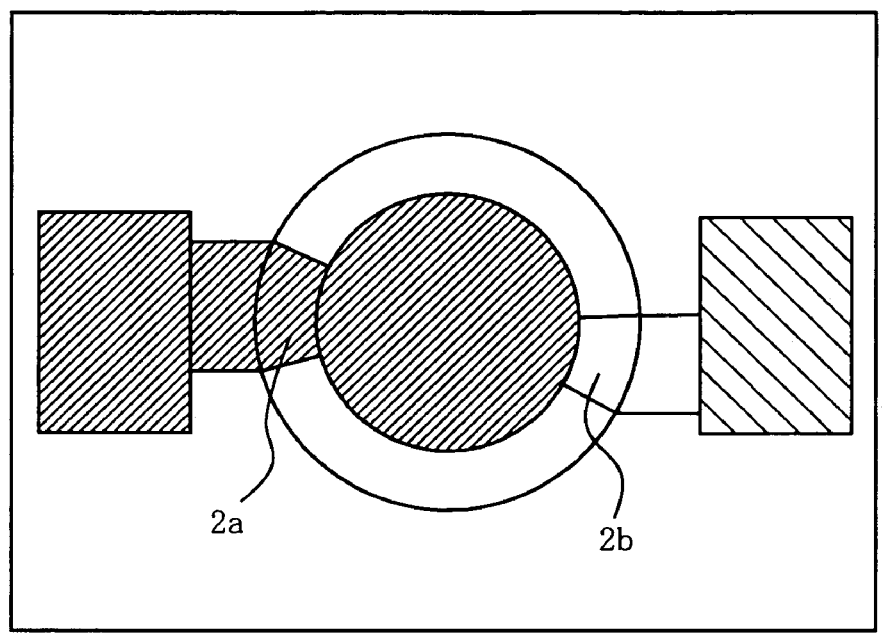
FIG. 17 is a view showing a variant example of the bridging portion.

As shown in FIG. 17, the first bridging portion 2a may be constituted by the piezoelectric layer and the upper electrode layer, and the second bridging portion 2b may be constituted by the piezoelectric layer and the lower electrode layer.

Figure 18:
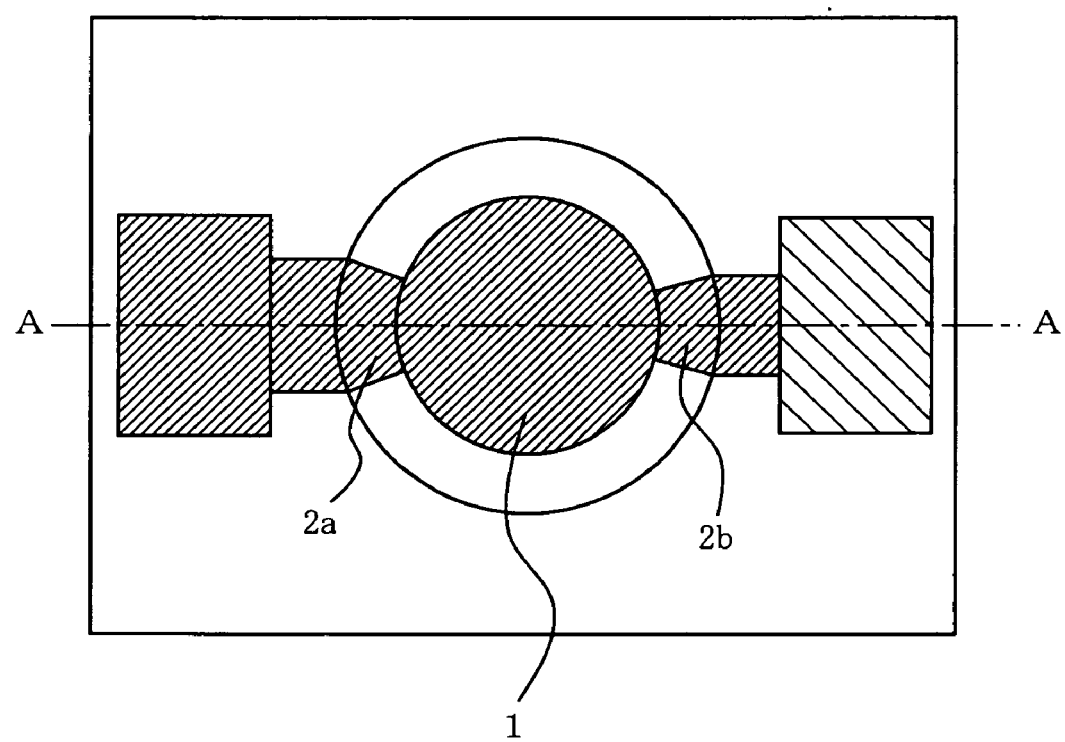
FIG. 18 is a view showing a variant example of the bridging portion.

As shown in FIG. 18, the piezoelectric element is prevented from being point-symmetric with respect to any point in the piezoelectric vibrating portion 1 by making the thickness of the first bridging portion 2a different from the thickness of the second bridging portion 2b, although it is line-symmetric with respect to a line A-A. The piezoelectric element shown in FIG. 18 is also encompassed in the present invention.

Figure 19:
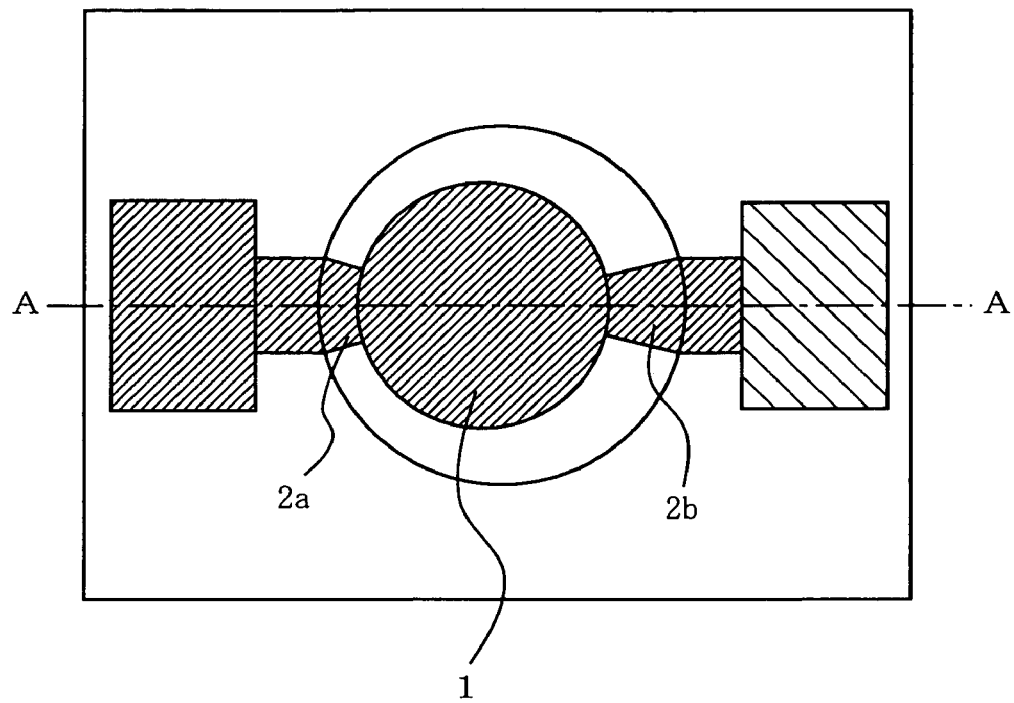
FIG. 19 is a view showing a variant example of the bridging portion.

As shown in FIG. 19, the piezoelectric element is prevented from being point-symmetric with respect to any point in the piezoelectric vibrating portion 1 by making the length of the first bridging portion 2a different from the length of the second bridging portion 2b, although it is line-symmetric with respect to a line A-A. The piezoelectric element shown in FIG. 19 is also encompassed in the present invention.

Figure 20:
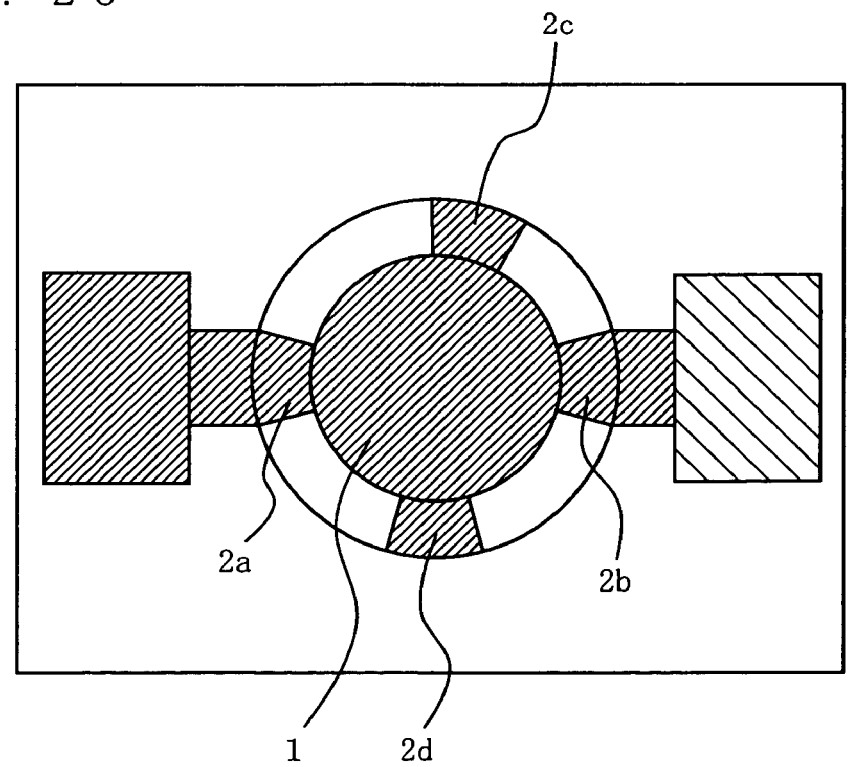
FIG. 20 is a view showing a variant example of the bridging portion.

As shown in FIG. 20, the first to the fourth bridging portions 2a, 2b, 2c and 2d have the same thickness, length and shape. However, the first to the fourth bridging portions 2a, 2b, 2c and 2d are arranged so as not to be line-symmetric with respect to any line segment traversing the piezoelectric vibrating portion 1 and so as not to be point-symmetric with respect to any point in the piezoelectric vibrating portion 1 in the projection of the piezoelectric vibrating portion 1 in the laminating direction. The piezoelectric element shown in FIG. 20 is also encompassed in the present invention.

Figure 21:
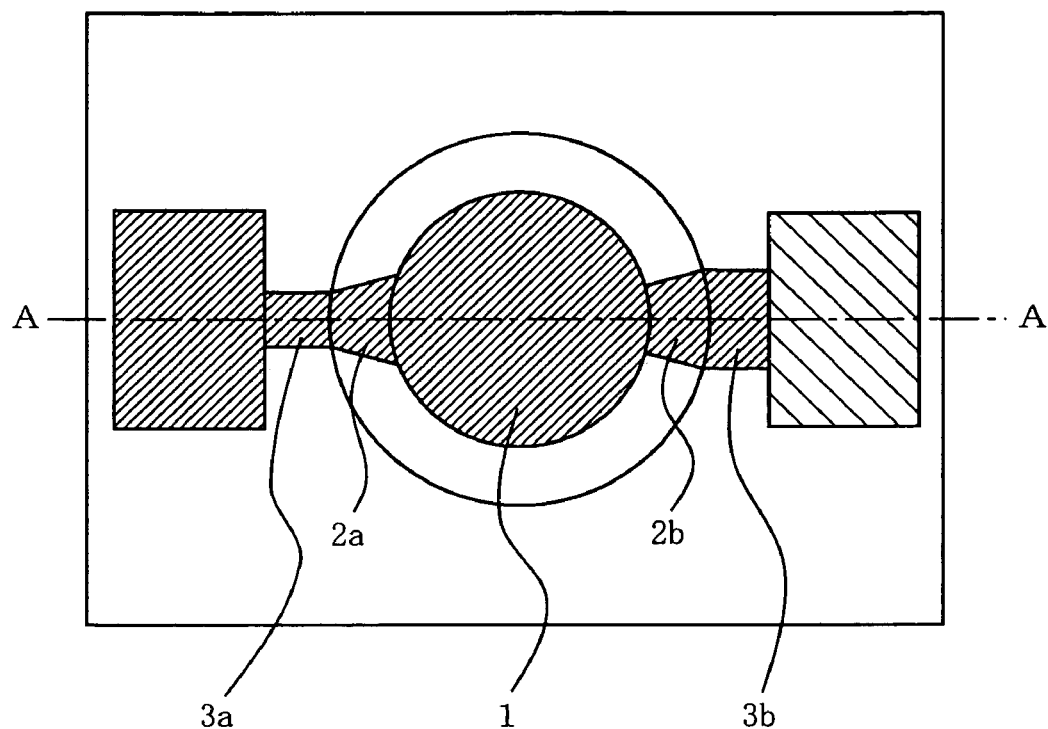
FIG. 21 is a view showing a variant example of the bridging portion.

As shown in FIG. 21, the first and the second bridging portions 2a and 2b have the same thickness and length. However, the piezoelectric element is prevented from being point-symmetric with respect to any point in the piezoelectric vibrating portion 1 by making the thickness of the first wiring electrode 3a different from the thickness of the second wiring electrode 3b, although it is line-symmetric with respect to a line A-A. The piezoelectric element shown in FIG. 21 is also encompassed in the present invention.

Figure 22:
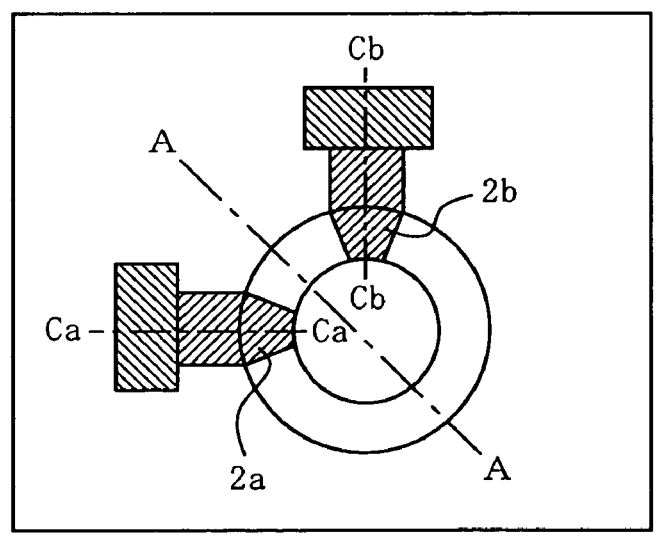
FIG. 22 is a view showing a variant example of the bridging portion.

As shown in FIG. 22, the first and the second bridging portions 2a and 2b may be arranged such that the central line Ca-Ca of the first bridging portion 2a is perpendicular to the central line Cb-Cb of the second bridging portion 2b. In this case, the piezoelectric element is prevented from being point-symmetric with respect to any point in the piezoelectric vibrating portion 1, although it is line-symmetric with respect to a line A-A. The piezoelectric element shown in FIG. 22 is also encompassed in the present invention.

Tenth Embodiment

Figure 23:
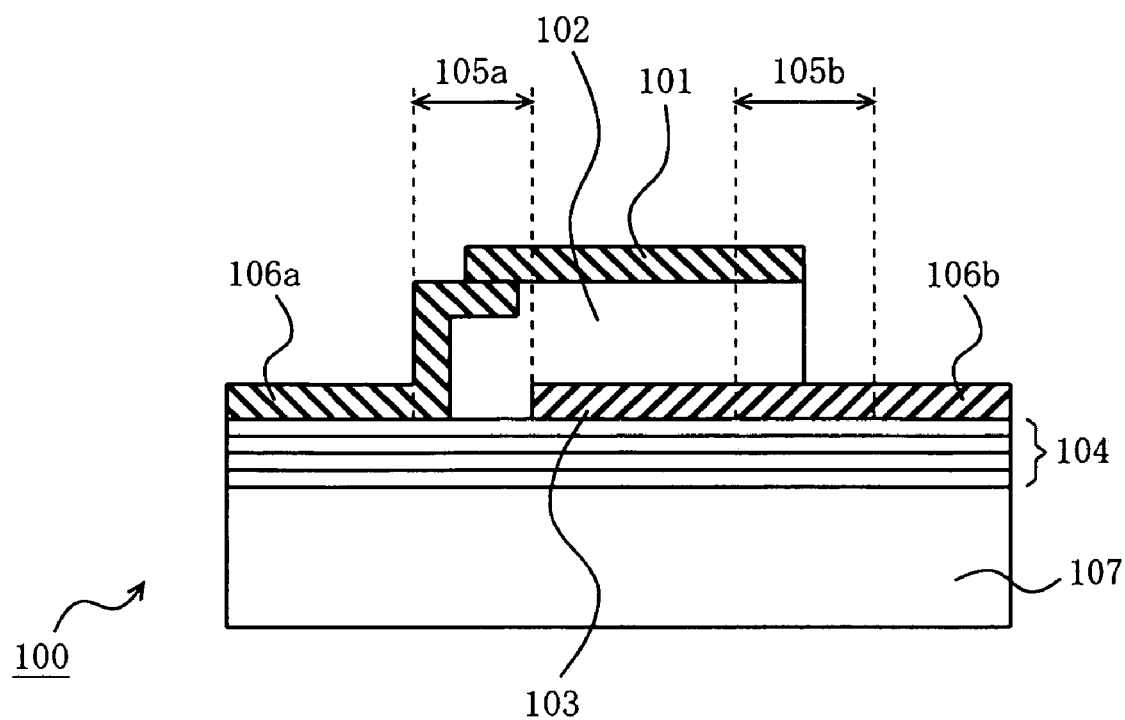
FIG. 23 is a cross-sectional view showing a mirror piezoelectric element of a tenth embodiment of the present invention.

The present invention can also be applied to a mirror piezoelectric element. FIG. 23 is a cross-sectional view showing a mirror piezoelectric element of a tenth embodiment of the present invention. In FIG. 23, the mirror piezoelectric element 100 includes an upper electrode layer 101, a piezoelectric layer 102, a lower electrode layer 103, a mirror layer 104, a first joint portion 105a, a second joint portion 105b, a first wiring electrode 106a, a second wiring electrode 106b, and a substrate 107. A piezoelectric vibrating portion is formed with the upper electrode layer 101, the piezoelectric layer 102 and the lower electrode layer 103.

The first joint portion 105a is constituted by an electrode extended from a portion of the periphery of the upper electrode layer 101, and a piezoelectric substance drawn from the piezoelectric layer 102 toward a portion above the mirror layer 104. The first joint portion 105a electrically connects the first wiring electrode 106a to the upper electrode layer 101 and mechanically connects the piezoelectric vibrating portion and the first wiring electrode 106a.

The second joint portion 105b is constituted by an electrode extended from a portion of the periphery of the lower electrode layer 103, and a piezoelectric substance drawn from the piezoelectric layer 102 toward a portion above the mirror layer 104. The second joint portion 105b electrically connects the second wiring electrode 106b to the lower electrode layer 103 and mechanically connects the piezoelectric vibrating portion and the second wiring electrode 106b.

The first and the second joint portions 105a and 105b are arranged so as not to be line-symmetric with respect to any line segment traversing the piezoelectric vibrating portion and/or so as not to be point-symmetric with respect to any point in the piezoelectric vibrating portion in the projection of the piezoelectric vibrating portion in the laminating direction. The arrangement pattern of the first and the second joint portions 105a and 105b is, for example, a pattern in which the cavity portion 25 in FIG. 1A is replaced by the mirror layer 104.

Thus, in the tenth embodiment, the joint portions are arranged so as not to be line-symmetric with respect to any line segment traversing the piezoelectric vibrating portion and/or so as not to be point-symmetric with respect to any point in the piezoelectric vibrating portion in the projection of the piezoelectric vibrating portion in the laminating direction. Therefore, the piezoelectric vibrating portion is hardly twisted. Furthermore, in the piezoelectric vibrating portion, the vibration hardly occurs in the lateral direction. Therefore, in the piezoelectric element 100 of the tenth embodiment, there is hardly any source for spurious responses. Therefore, in the piezoelectric element of the tenth embodiment, spurious responses caused by the symmetry of the supporting portions can be suppressed, compared with the conventional piezoelectric element. As a result, the piezoelectric element of the tenth embodiment serves as a resonator having good frequency characteristics that can attenuate unwanted vibration modes.

It should be noted that, similarly to the first embodiment, the piezoelectric element of the tenth embodiment can be modified according to the various variant examples described in this specification.

In this embodiment, two or three bridging portions are used, for example. However, the present invention is not limited thereto, and the number of the bridging portions can be increased, if necessary.

Furthermore, a filter is shown as an example of the composite piezoelectric element in this embodiment. However, the present invention is not limited thereto, and the composite piezoelectric element of the present invention can be applied to inkjet printer heads, sensors or other various devices.

Eleventh Embodiment

Next, a configuration in which the piezoelectric element of the present invention is applied to a ladder filter will be described with reference to FIG. 24.

Figure 24:
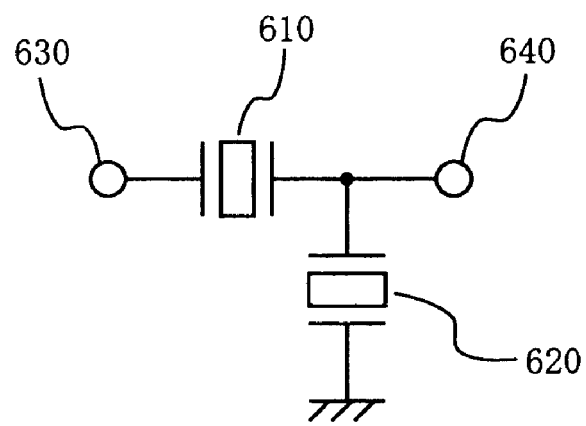
FIG. 24 is a diagram showing the configuration of a ladder filter 600 of an eleventh embodiment of the present invention.

FIG. 24 is a diagram showing the configuration of a ladder filter 600 of an eleventh embodiment of the present invention. In FIG. 24, the ladder filter 600 includes a first piezoelectric element 610, a second piezoelectric element 620 and input/output terminals 630 and 640. The first and the second piezoelectric elements 610 and 620 are piezoelectric elements as shown in any of the first to the tenth embodiments.

The first piezoelectric element 610 is connected in series between the input/output terminals 630 and 640. Therefore, the first piezoelectric element 610 is operated as a serial resonator.

The second piezoelectric element 620 is connected in parallel between the input/output terminals 630 and 640 and grounded. Therefore, the second piezoelectric element 620 is operated as a parallel resonator.

The piezoelectric resonators are connected in this manner, so that a filter is configured as an L-shaped ladder filter.

The thickness of each piezoelectric element is set such that the resonant frequency of the first piezoelectric element 610 is different from the resonant frequency of the second piezoelectric element 620. The resonant frequency of the first piezoelectric element 610 is set to be higher than that of the second piezoelectric element 620. Thus, a ladder filter having bandpass characteristics can be realized. Preferably, the resonant frequency of the first piezoelectric element 610 is matched with the anti-resonant frequency of the second piezoelectric element 620, or is set to be in the vicinity thereof. With this, a ladder filter having better smoothness of the passband can be realized.

In the eleventh embodiment, the filter is a one-stage ladder filter, but the piezoelectric element of the present invention can be used for a multi-stage ladder filter.

In the eleventh embodiment, the filter has a L-shaped ladder configuration, but can be a filter having other configurations such as a T-shaped or π-type multi-stage configuration to obtain the same effect. Needless to say, the same effect can be obtained with a T-type or π-type multi-stage configuration.

Furthermore, the same effect can be obtained, not only with a ladder-type, but also with a lattice filter configuration. In other words, the configuration is not limited to the above-described configurations and can be any configuration, as long as the filter uses at least one piezoelectric element of the present invention.

Twelfth Embodiment

In the twelfth embodiment, the configuration of an antenna duplexer and communication equipment using the piezoelectric element of the above-described embodiments will be described.

Figure 25:
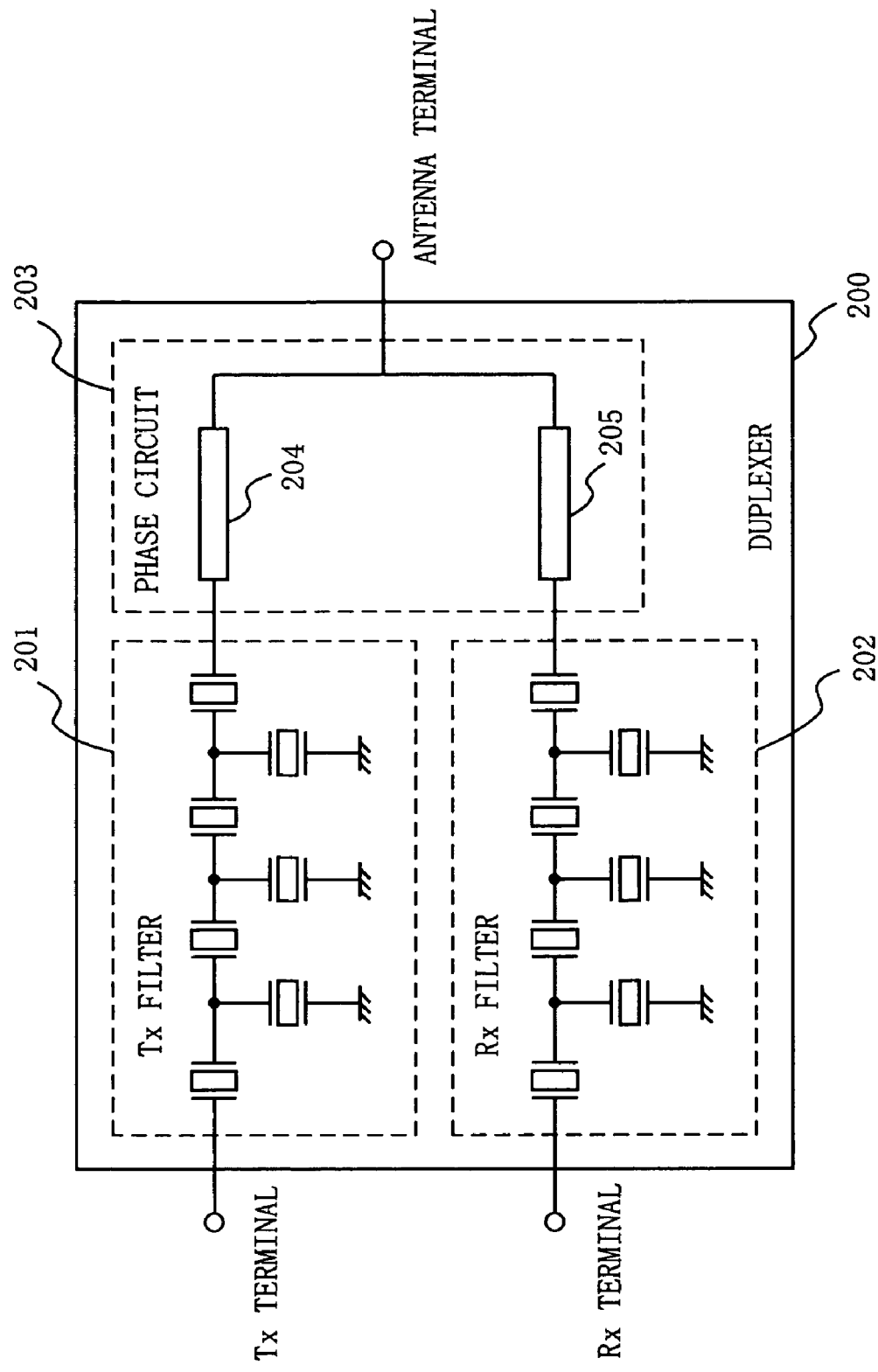
FIG. 25 is a diagram showing the configuration of an antenna duplexer 200 of a twelfth embodiment of the present invention.

FIG. 25 is a diagram showing the configuration of an antenna duplexer 200 of the twelfth embodiment of the present invention. In FIG. 25, the antenna duplexer 200 includes a Tx filter (transmitting filter) 201 to which the piezoelectric element of the present invention is applied, an Rx filter (receiving filter) 202 to which the piezoelectric element of the present invention is applied, and a phase shifter 203 including two transmission lines 204 and 205. The Tx filter 201 allows the signals of the transmitting band to pass through and attenuates the signals of the receiving band. The Rx filter 202 allows the signals of the receiving band to pass through and attenuates the signals of the transmitting band. Thus, an antenna duplexer having excellent characteristics such as low loss can be obtained. It should be noted that the number of filters or the number of stages of the piezoelectric resonators constituting a filter is not limited to that shown in FIG. 24, and can be designed as desired. It is sufficient that at least one piezoelectric element of the present invention is used as piezoelectric elements constituting the Tx filter 201 and/or the Rx filter 202.

Figure 26:
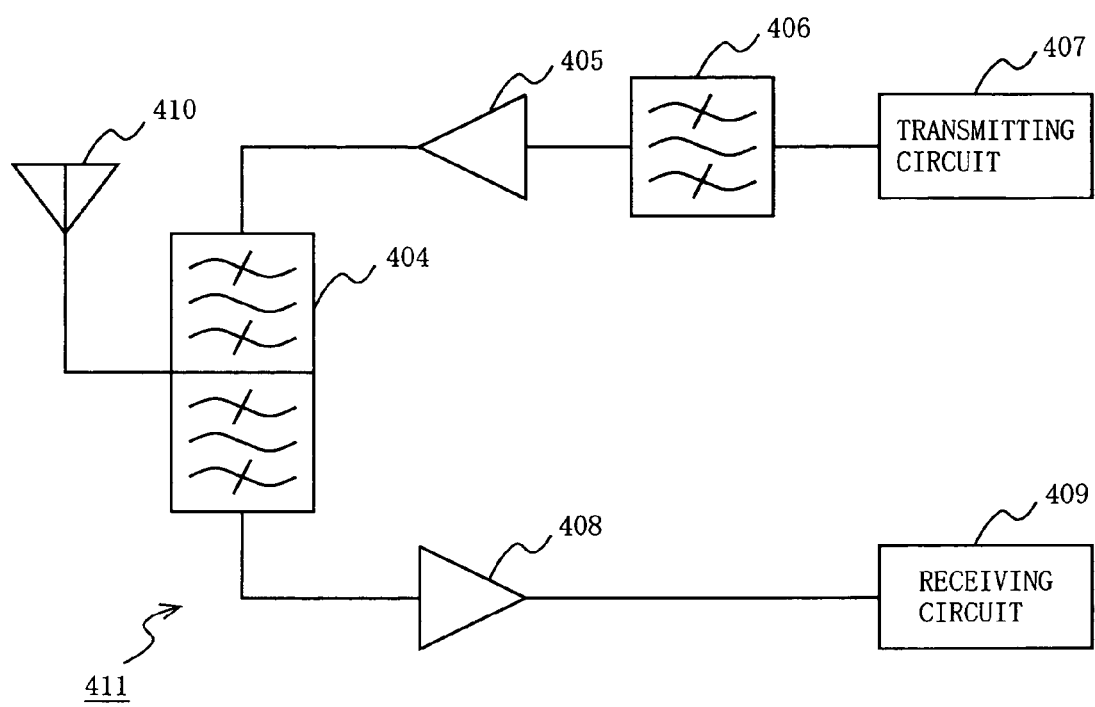
FIG. 26 is a diagram showing the configuration of communication equipment 411 of the twelfth embodiment of the present invention.
Figure 27A:
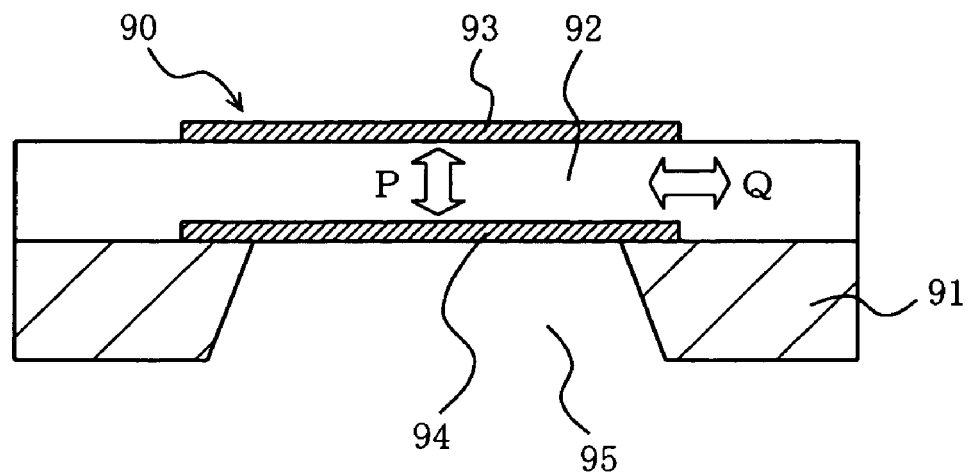
FIG. 27A is a schematic cross-sectional view of a conventional piezoelectric element.
Figure 27B:
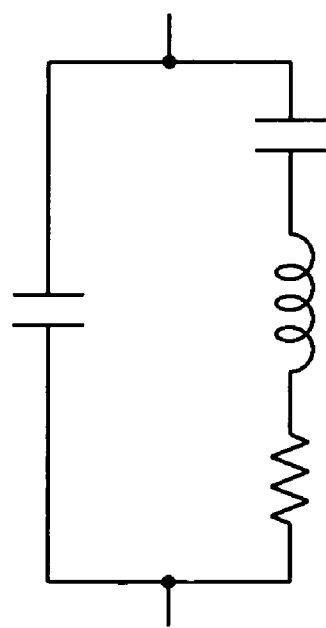
FIG. 27B is an equivalent circuit diagram of the conventional piezoelectric element.
Figure 28A:
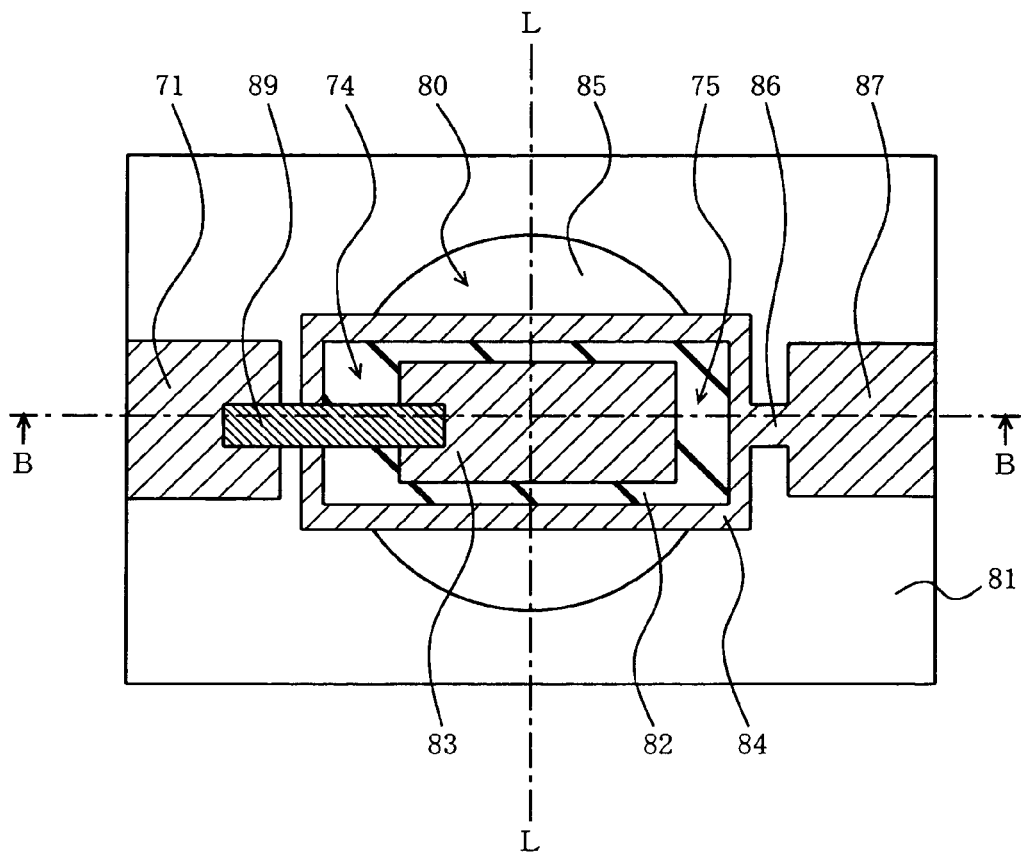
FIG. 28A is a top view of a conventional piezoelectric element disclosed in International Publication No. 98/52280.
Figure 28B:
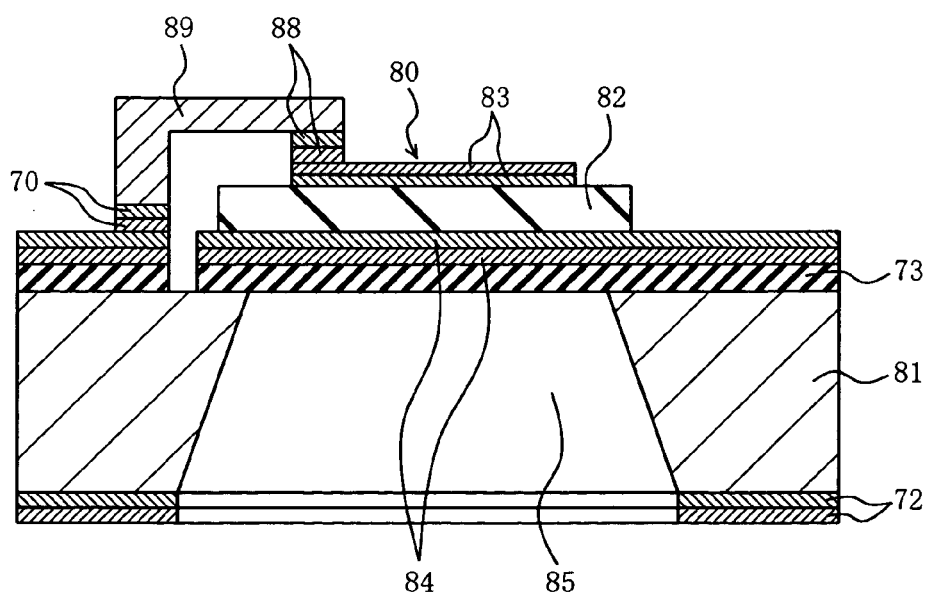
FIG. 28B is a cross-sectional view taken along the line B-B of the conventional piezoelectric element shown in FIG. 28A.
Figure 29A:
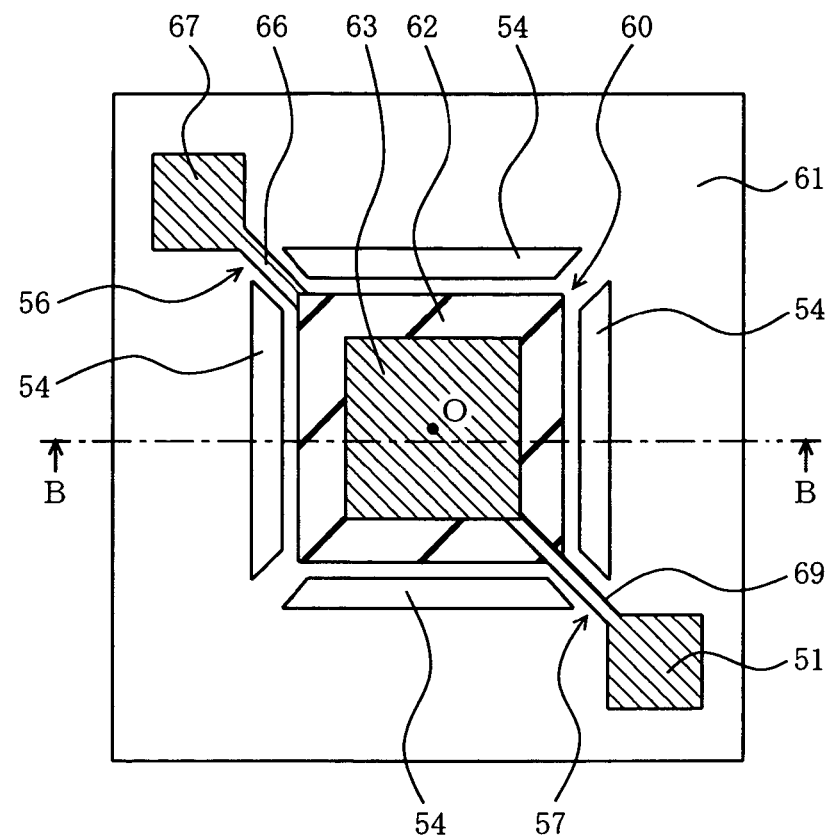
FIG. 29A is a top view of another conventional piezoelectric element disclosed in Japanese Laid-Open Patent Publication No. 9-130199.
Figure 29B:
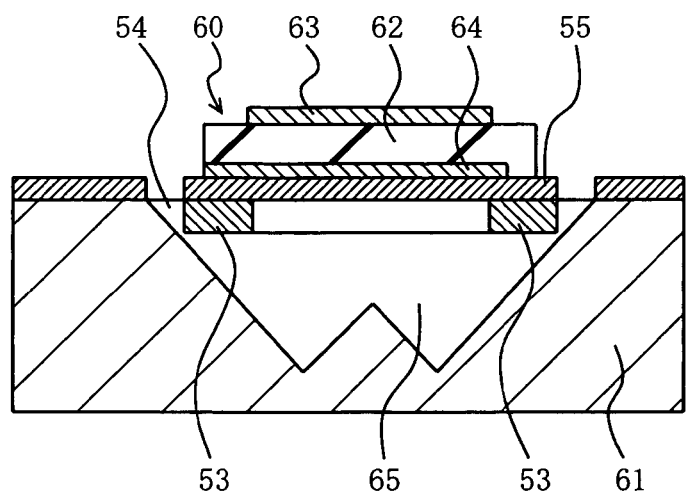
FIG. 29B is a cross-sectional view taken along the line B-B of the conventional piezoelectric element shown in FIG. 29A.

FIG. 26 is a diagram showing the configuration of communication equipment 411 of the twelfth embodiment of the present invention. In FIG. 26, the communication equipment 411 includes the antenna duplexer 404 shown in FIG. 25, a transmitting amplifier 405, a filter 406, a transmitting circuit 407, a receiving amplifier 408, a receiving circuit 409, and an antenna 410. A transmission signal output from the transmitting circuit 407 is input to the antenna duplexer 404 via the filter 406 and the transmitting amplifier 405. The transmission signal input to the antenna duplexer 404 is transmitted via the antenna 410. On the other hand, a received signal that is received at the antenna 410 is input to the receiving circuit 409 via the antenna duplexer 404 and the receiving amplifier 408. Thus, when the antenna duplexer 404 having excellent characteristics such as low loss is used, compact and high performance communication equipment can be realized. The piezoelectric element of the present invention also can be used for the filter 406. Furthermore, the communication equipment is not limited to the one shown in FIG. 26 as an example and can be designed as desired. The portion in which the piezoelectric element of the present invention is used is not limited to a duplexer or a filter. The piezoelectric element of the present invention may be used for a filter on the receiving side.

Thus, an antenna duplexer or communication equipment having good characteristics can be realized by using the piezoelectric element of the present invention for the antenna duplexer or the communication equipment.

The present invention is a piezoelectric element or a composite piezoelectric element having good frequency characteristic in which the laterally propagating acoustic wave modes are suppressed, and therefore the present invention is useful for portable equipment, communication equipment or the like.

While the invention has been described in detail, the foregoing description is in all aspects illustrative and not restrictive. It is understood that numerous other modifications and variations can be devised without departing from the scope of the invention.

What is claimed is:

1. A piezoelectric element comprising:
a substrate;
a lower electrode layer laminated on or above the substrate;
a piezoelectric layer laminated on or above the lower electrode layer;
an upper electrode layer laminated on or above the piezoelectric layer;
a cavity portion formed below a piezoelectric vibrating portion including the lower electrode layer, the piezoelectric layer and the upper electrode layer; and
at least two bridging portions extending from a portion of a periphery of the piezoelectric vibrating portion, for supporting the piezoelectric vibrating portion with the substrate above the cavity portion,
wherein the at least two bridging portions are formed so as not to be line-symmetric with respect to any line segment traversing the piezoelectric vibrating portion and so as not to be point-symmetric with respect to any point in the piezoelectric vibrating portion in a projection of the piezoelectric vibrating portion in the laminating direction.

2. The piezoelectric element according to claim 1, wherein the cavity portion is formed by processing the substrate.

3. The piezoelectric element according to claim 1, wherein the cavity portion is formed by processing a cavity portion-forming layer for forming the cavity portion that is provided on the substrate.

4. The piezoelectric element according to claim 1, further comprising a dielectric layer provided so as to be in contact with at least one selected from the group consisting of the lower electrode layer, the piezoelectric layer and the upper electrode layer.

5. The piezoelectric element according to claim 4, wherein the dielectric layer is provided between the substrate and the lower electrode layer.

6. The piezoelectric element according to claim 4, wherein the bridging portions are formed by extending at least one selected from the group consisting of the lower electrode layer, the piezoelectric layer, the upper electrode layer and the dielectric layer.

7. The piezoelectric element according to claim 4, wherein the at least one selected from the group consisting of the lower electrode layer, the piezoelectric layer, the upper electrode layer and the dielectric layer is formed so as to extend up to at least a portion of a peripheral portion of the cavity portion.

8. The piezoelectric element according to claim 1, wherein the at least two bridging portions comprise:
a first bridging portion including a portion extended from the upper electrode layer; and
a second bridging portion including a portion extended from the lower electrode layer; and
the piezoelectric element further comprises:
a first wiring electrode that is provided in a peripheral portion of the cavity portion on or above the substrate so as to be electrically connected to the portion extended from the upper electrode layer and that is connected to a first terminal electrode, and
a second wiring electrode that is provided in a peripheral portion of the cavity portion on or above the substrate so as to be electrically connected to the portion extended from the lower electrode layer and that is connected to a second terminal electrode.

9. The piezoelectric element according to claim 8, wherein the first wiring electrode is provided such that a first central line connecting the center of the piezoelectric vibrating portion and the center of the first bridging portion is not overlapped with a second central line connecting the center of the piezoelectric vibrating portion and the center of the first wiring electrode in a projection in the laminating direction, and
the second wiring electrode is provided such that a third central line connecting the center of the piezoelectric vibrating portion and the center of the second bridging portion is not overlapped with a fourth central line connecting the center of the piezoelectric vibrating portion and the center of the second wiring electrode in a projection in the laminating direction.

10. The piezoelectric element according to claim 9, wherein the first bridging portion is provided such that the first bridging portion is not provided between the piezoelectric vibrating portion and the first wiring electrode in the laminating direction, and
the second bridging portion is provided such that the second bridging portion is not provided between the piezoelectric vibrating portion and the second wiring electrode in the laminating direction.

11. The piezoelectric element according to claim 1, further comprising:
a first relay electrode electrically connected to the upper electrode layer extending up to a periphery of the cavity portion via the at least two bridging portions; and
a second relay electrode electrically connected to the lower electrode layer extending up to a periphery of the cavity portion via the at least two bridging portions.

12. The piezoelectric element according to claim 11, wherein at least one of the first relay electrode and the second relay electrode is provided in a ring-shape or a frame-shape along the periphery of the cavity portion.

13. A composite piezoelectric element in which at least two piezoelectric elements are electrically connected to each other, at least one of the piezoelectric elements comprising:
a substrate;
a lower electrode layer laminated on or above the substrate;
a piezoelectric layer laminated on or above the lower electrode layer;
an upper electrode layer laminated on or above the piezoelectric layer;
a cavity portion formed below a piezoelectric vibrating portion including the lower electrode layer, the piezoelectric layer and the upper electrode layer; and
at least two bridging portions extending from a portion of a periphery of the piezoelectric vibrating portion, for supporting the piezoelectric vibrating portion with the substrate above the cavity portion,
wherein the at least two bridging portions are formed so as not to be line-symmetric with respect to any line segment traversing the piezoelectric vibrating portion and so as not to be point-symmetric with respect to any point in the piezoelectric vibrating portion in a projection of the piezoelectric vibrating portion in the laminating direction.

14. A piezoelectric element comprising:
a substrate;
a lower electrode layer laminated on or above the substrate;
a piezoelectric layer laminated on or above the lower electrode layer,
an upper electrode layer laminated on or above the piezoelectric layer;
a mirror layer formed below a piezoelectric vibrating portion including the lower electrode layer, the piezoelectric layer and the upper electrode layer;
a first joint portion including a portion extended from the upper electrode layer, for electrically and mechanically connecting to a first wiring electrode formed on the mirror layer; and
a second joint portion including a portion extended from the lower electrode layer, for electrically and mechanically connecting to a second wiring electrode formed on the mirror layer,
wherein the first joint portion and the second joint portion are formed so as not to be line-symmetric with respect to any line segment traversing the piezoelectric vibrating portion and so as not to be point-symmetric with respect to any point in the piezoelectric vibrating portion in a projection of the piezoelectric vibrating portion in the laminating direction.

15. A filter comprising a plurality of piezoelectric elements, at least one of the piezoelectric elements comprising:
a substrate;
a lower electrode layer laminated on or above the substrate;

a piezoelectric layer laminated on or above the lower electrode layer;

an upper electrode layer laminated on or above the piezoelectric layer;

a cavity portion formed below a piezoelectric vibrating portion including the lower electrode layer, the piezoelectric layer and the upper electrode layer; and at least two bridging portions extending from a portion of a periphery of the piezoelectric vibrating portion, for supporting the piezoelectric vibrating portion with the substrate above the cavity portion, wherein the at least two bridging portions are formed so as not to be line-symmetric with respect to any line segment traversing the piezoelectric vibrating portion and so as not to be point-symmetric with respect to any point in the piezoelectric vibrating portion in a projection of the piezoelectric vibrating portion in the laminating direction.

16. A duplexer comprising a filter including a plurality of piezoelectric elements, at least one of the piezoelectric elements comprising:

a substrate;

a lower electrode layer laminated on or above the substrate;

a piezoelectric layer laminated on or above the lower electrode layer;

an upper electrode layer laminated on or above the piezoelectric layer;

a cavity portion formed below a piezoelectric vibrating portion including the lower electrode layer, the piezoelectric layer and the upper electrode layer; and at least two bridging portions extending from a portion of a periphery of the piezoelectric vibrating portion, for supporting the piezoelectric vibrating portion with the substrate above the cavity portion, wherein the at least two bridging portions are formed so as not to be line-symmetric with respect to any line segment traversing the piezoelectric vibrating portion and so as not to be point-symmetric with respect to any point in the piezoelectric vibrating portion in a projection of the piezoelectric vibrating portion in the laminating direction.

17. A communication equipment comprising a piezoelectric element, the piezoelectric element comprising:

a substrate;

a lower electrode layer laminated on or above the substrate;

a piezoelectric layer laminated on or above the lower electrode layer;

an upper electrode layer laminated on or above the piezoelectric layer;

a cavity portion formed below a piezoelectric vibrating portion including the lower electrode layer, the piezoelectric layer and the upper electrode layer; and at least two bridging portions extending from a portion of a periphery of the piezoelectric vibrating portion, for supporting the piezoelectric vibrating portion with the substrate above the cavity portion, wherein the at least two bridging portions are formed so as not to be line-symmetric with respect to any line segment traversing the piezoelectric vibrating portion and so as not to be point-symmetric with respect to any point in the piezoelectric vibrating portion in a projection of the piezoelectric vibrating portion in the laminating direction.

* * * * *

UNITED STATES PATENT AND TRADEMARK OFFICE
CERTIFICATE OF CORRECTION

| | |
|---|---|
| PATENT NO. | : 7,224,105 B2 |
| APPLICATION NO. | : 10/990435 |
| DATED | : May 29, 2007 |
| INVENTOR(S) | : Keiji Onishi et al. |

Page 1 of 1

It is certified that error appears in the above-identified patent and that said Letters Patent is hereby corrected as shown below:

Column 28

Line 42, "electrode layer," should read --electrode layer;--.

Signed and Sealed this

Sixteenth Day of October, 2007

JON W. DUDAS
*Director of the United States Patent and Trademark Office*